United States Patent
Tsukada et al.

(10) Patent No.: US 9,673,046 B2
(45) Date of Patent: Jun. 6, 2017

(54) GALLIUM NITRIDE SUBSTRATE AND MANUFACTURING METHOD OF NITRIDE SEMICONDUCTOR CRYSTAL

(71) Applicant: MITSUBISHI CHEMICAL CORPORATION, Tokyo (JP)

(72) Inventors: Yusuke Tsukada, Ushiku (JP); Shuichi Kubo, Ushiku (JP); Kazunori Kamada, Ushiku (JP); Hideo Fujisawa, Ushiku (JP); Tatsuhiro Ohata, Kitakyushu (JP); Hirotaka Ikeda, Ushiku (JP); Hajime Matsumoto, Yokohama (JP); Yutaka Mikawa, Ushiku (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 14/740,725

(22) Filed: Jun. 16, 2015

(65) Prior Publication Data

US 2015/0311068 A1    Oct. 29, 2015

Related U.S. Application Data

(63) Continuation of application No. PCT/JP2013/083110, filed on Dec. 10, 2013.

(30) Foreign Application Priority Data

Dec. 17, 2012  (JP) .................................. 2012-275035
Mar. 29, 2013  (JP) .................................. 2013-072629
May 30, 2013  (JP) .................................. 2013-114619

(51) Int. Cl.
*H01L 21/02* (2006.01)
*C30B 25/00* (2006.01)
(Continued)

(52) U.S. Cl.
CPC ........ *H01L 21/02433* (2013.01); *C30B 25/00* (2013.01); *C30B 25/02* (2013.01);
(Continued)

(58) Field of Classification Search
CPC ......... H01L 21/02458; H01L 21/02516; H01L 21/02576; H01L 33/007; H01L 33/12; C30B 25/00; C30B 25/02; C30B 29/406
See application file for complete search history.

(56) References Cited

U.S. PATENT DOCUMENTS

2002/0028564 A1    3/2002   Motoki et al.
2004/0072410 A1    4/2004   Motoki et al.
(Continued)

FOREIGN PATENT DOCUMENTS

JP    2002-29897     1/2002
JP    2006-509710    3/2006
(Continued)

OTHER PUBLICATIONS

International Preliminary Report on Patentability and Written Opinion issued Jul. 2, 2015 in PCT/JP2013/083110 filed Dec. 10, 2013.
(Continued)

*Primary Examiner* — Jessica Manno
*Assistant Examiner* — Mohammed R Alam
(74) *Attorney, Agent, or Firm* — Oblon, McClelland, Maier & Neustadt, L.L.P.

(57) ABSTRACT

The invention provides a nonpolar or semipolar GaN substrate, in which a nitride semiconductor crystal having a low stacking fault density can be epitaxially grown on the main surface of the substrate, and a method for manufacturing an M-plane GaN substrate by forming a mask pattern having a line-shaped opening parallel to an a-axis of a C-plane GaN substrate on an N-polar plane of the C-plane GaN substrate, growing a plane-shape GaN crystal of which thickness
(Continued)

direction is an m-axis direction from the opening of the mask pattern by an ammonothermal method, and cutting out the M-plane GaN substrate from the plane-shape GaN crystal.

18 Claims, 11 Drawing Sheets

(51) Int. Cl.
  *C30B 25/02*   (2006.01)
  *C30B 29/40*   (2006.01)
  *H01L 29/32*   (2006.01)
  *H01L 33/00*   (2010.01)
  *H01L 33/12*   (2010.01)

(52) U.S. Cl.
  CPC ........ *C30B 29/406* (2013.01); *H01L 21/0254* (2013.01); *H01L 21/0262* (2013.01); *H01L 21/02389* (2013.01); *H01L 21/02458* (2013.01); *H01L 21/02516* (2013.01); *H01L 21/02576* (2013.01); *H01L 21/02609* (2013.01); *H01L 21/02639* (2013.01); *H01L 29/32* (2013.01); *H01L 33/007* (2013.01); *H01L 33/12* (2013.01)

(56) References Cited

U.S. PATENT DOCUMENTS

| | | |
|---|---|---|
| 2004/0244680 A1 | 12/2004 | Dwilinski et al. |
| 2005/0214992 A1 | 9/2005 | Chakraborty et al. |
| 2006/0057749 A1 | 3/2006 | Dwilinski et al. |
| 2007/0184637 A1* | 8/2007 | Haskell ............. H01L 21/02378 438/481 |
| 2008/0001165 A1* | 1/2008 | Hashimoto ............... C30B 7/10 257/103 |
| 2009/0078944 A1* | 3/2009 | Kubota .................. B82Y 20/00 257/88 |
| 2011/0163326 A1 | 7/2011 | Matsumoto |
| 2012/0000415 A1 | 1/2012 | D'Evelyn et al. |
| 2012/0074403 A1 | 3/2012 | Fujiwara et al. |
| 2013/0119401 A1 | 5/2013 | D'Evelyn et al. |
| 2013/0264606 A1 | 10/2013 | Kubo et al. |
| 2015/0093318 A1 | 4/2015 | Enatsu et al. |

FOREIGN PATENT DOCUMENTS

| | | |
|---|---|---|
| JP | 2008-501606 | 1/2008 |
| JP | 2012-66983 | 4/2012 |
| JP | 2013-035711 | 2/2013 |
| JP | 2013-209260 | 10/2013 |
| JP | 2013-227208 | 11/2013 |
| WO | WO 99/23693 | 5/1999 |
| WO | WO 02/101125 | 12/2002 |
| WO | WO 2005/012267 | 12/2005 |
| WO | WO 2012/074031 | 6/2012 |

OTHER PUBLICATIONS

Melvin McLaurin et al., "P-type conduction in stacking-fault-free m-plane GaN", Physica Status Solidi (RRL), vol. 1, No. 3, p. 110-112 (2007).
Kenji Fujito et al., High-quality nonpolar m-plane GaN substrates grown by HVPE, phys. stat. sol. (a), vol. 205, No. 5, p. 1056-1059 (2008).
International Search Report issued Mar. 18, 2014 in PCT/JP2013/083110 filed Dec. 10, 2013.

* cited by examiner

GALLIUM NITRIDE SUBSTRATE AND MANUFACTURING METHOD OF NITRIDE SEMICONDUCTOR CRYSTAL

CROSS-REFERENCE TO RELATED APPLICATION

This is a continuation of International Application PCT/JP2013/083110, filed on Dec. 10, 2013, and designated the U.S., and claims priority from Japanese Patent Application 2012-275035 which was filed on Dec. 17, 2012, Japanese Patent Application 2013-072629 which was filed on Mar. 29, 2013, and Japanese Patent Application 2013-114619 which was filed on May 30, 2013, the entire contents of which are incorporated herein by reference.

TECHNICAL FIELD

The present invention is related to a gallium nitride substrate and a manufacturing method for manufacturing a nitride semiconductor crystal.

BACKGROUND ART

Nitride semiconductors represented by gallium nitride (GaN) are semiconductors composed of nitrides of metal elements classified to Group 13 in the periodic table, and also called Group III nitride semiconductors, gallium nitride group semiconductors, etc. The nitride semiconductor is sometimes represented by compositional formulas such as $(B,Al,Ga,In)N$, $(Al,Ga,In)N$, $B_xAl_yGa_zIn_{1-x-y-z}N$ (where, $0 \leq x \leq 1$, $0 \leq y \leq 1$, $0 \leq z \leq 1$, $0 \leq x+y+z \leq 1$), $Al_xGa_yIn_{1-x-y}N$ (where, $0 \leq x \leq 1$, $0 \leq y \leq 1$, $0 \leq x+y \leq 1$).

Doped with impuritys, the nitride semiconductor can be electrically conductive. O (oxygen), Si (silicon), Ge (germanium), etc. are known as n-type impuritys. Mg (magnesium), Zn (zinc), etc. are known as p-type impuritys.

The nitride semiconductor is composed of a wurzite structure classified to the hexagonal crystal system.

GaN substrates are manufactured by slicing a bulk GaN crystal grown by HVPE (Hydride Vapor Phase Epitaxy) method (Patent Document 1) or ammonothermal method (Patent Document 2, Patent Document 3).

A non-polar or semi-polar GaN substrate can be obtained by a method in which a bulk GaN crystal grown along the c-axis on a C-plane sapphire substrate or a C-plane GaN substrate is sliced so that the non-polar plane or the semi-polar plane appears as a main surface (Non-Patent Document 1). This method is not suitable for manufacturing a large-area substrate although it is advantageous in that a non-polar or semi-polar GaN substrate with low stacking fault density can be obtained. Therefore, it has been recently studied to manufacture a bulk GaN crystal by a homoepitaxial growth that uses a non-polar or semi-polar GaN substrate as a seed (Patent Document 4).

The Patent Document 4 says that the difference of impurity concentration between the GaN crystal to be grown and the seed must be $3 \times 10^{18}$ cm$^{-3}$ or less in order to homoepitaxially grow the GaN crystal with a stacking fault density of 100 cm$^{-1}$ or less by using a non-polar or semi-polar GaN substrate as a seed. This document does not describe an example for which a GaN crystal with a impurity concentration of $4 \times 10^{18}$ cm$^{-3}$ or more and a stacking fault density of 100 cm$^{-1}$ or less was homo-epitaxially grown on the non-polar GaN substrate.

PRIOR ART REFERENCES

Patent Documents

PD 1: International Publication WO 99/23693
PD 2: International Publication WO 2002/101125
PD 3: Japanese Unexamined Patent Application Publication No. JP-T-2006-509710
PD 4: Japanese Laid-open Patent Publication No. JP-A-2012-066983

Non-Patent Document

NPD 1: Kenji Fujito, et al., Phys. Stat. Sol. (a) 205 (2008) 1056

DISCLOSURE OF INVENTION

Problems to be Solved by the Invention

When a nitride semiconductor crystal is epitaxially grown on a non-polar or semi-polar GaN substrate, stacking fault newly formed in the crystal or inherited from the GaN substrate to the crystal deteriorates properties of semiconductor devices composed of the crystal.

Accordingly, a main object of the present invention is to provide a non-polar or semi-polar GaN substrate having a main surface on which a semiconductor crystal with low stacking fault density can be grown, and a technology necessary for manufacturing the substrate.

Means for Solving the Problems

The present inventors have completed the invention by finding that basal plane dislocation appeared on the main surface of a non-polar or semi-polar GaN crystal is involved with the generation of stacking fault in a nitride semiconductor crystal to be grown on the main surface.

According to the first aspect of the present invention, there is provided a gallium nitride substrate and a method for manufacturing a nitride semiconductor crystal, including:

(a1) a gallium nitride substrate having a first main surface and a second main surface opposite thereto, wherein the first main surface is a non-polar or semi-polar plane, and averaged basal plane dislocation density in an optional square region sizing 250 µm×250 µm in the first main plan is $1 \times 10^6$ cm$^{-2}$ or less;

(a2) the gallium nitride substrate according to (a1), wherein basal plane dislocation density in the first main surface is $1 \times 10^4$ cm$^{-2}$ or less;

(a3) the gallium nitride substrate according to (a2), wherein the basal plane dislocation density in the first main surface is 10 cm$^{-2}$ or less;

(a4) the gallium nitride substrate according to (a2) or (a3), wherein averaged basal plane dislocation density in an optional square region sizing 250 µm×250 µm in the first main plan is $1 \times 10^4$ cm$^{-2}$ or less;

(a5) the gallium nitride substrate according to any one of (a1) to (a4), wherein the area of the first main surface is 1.0 cm$^2$ or more;

(a6) the gallium nitride substrate according to any one of (a1) to (a5), wherein stacking fault density in the first main surface is 10 cm$^{-1}$ or less;

(a7) the gallium nitride substrate according to any one of (a1) to (a6), wherein the first main surface is an M-plane;

(a8) the gallium nitride substrate according to any one of (a1) to (a7), wherein the first main surface is a surface exposed by removing a damaged layer formed by slicing processing;
(a9) a method for manufacturing a nitride semiconductor crystal, comprising the crystal growth step of growing a nitride semiconductor crystal on the first main surface of the gallium nitride substrate according to any one of (a1) to (a8);
(a10) the method according to (a9), wherein at the crystal growth step, the nitride semiconductor crystal is grown by a vapor phase growth method;
(a11) the method according to (a10), wherein the vapor phase epitaxy method is HVPE method;
(a12) the method according to (a11), wherein a bulk nitride semiconductor crystal is grown at the crystal growth step;
(a13) the method according to (a10), wherein the vapor phase epitaxy method is MOCVD method;
(a14) the method according to (a13), wherein a thin film of the nitride semiconductor crystal is grown at the crystal growth step; and
(a15) the method according to any one of (a9) to (a14), wherein the nitride semiconductor crystal grown directly on the first main surface at the crystal growth step is a GaN crystal.

According to the second aspect of the present invention, there is provided a gallium nitride substrate and a method for manufacturing a nitride semiconductor crystal, including:
(b1) a gallium nitride substrate having a first main surface and a second main surface opposite thereto, wherein the first main surface is a M-plane, carrier density is $3 \times 10^{18}$ cm$^{-3}$ or more, and stacking fault density in the first main surface is 100 cm$^{-1}$ or less;
(b2) the gallium nitride substrate according to (b1), wherein the carrier density is $4 \times 10^{18}$ cm$^{-3}$ or more;
(b3) the gallium nitride substrate according to (b2), wherein the carrier density is $5 \times 10^{18}$ cm$^{-3}$ or more;
(b4) the gallium nitride substrate according to any one of (b1) to (b3), wherein oxygen concentration is $4 \times 10^{18}$ cm$^{-3}$ or more;
(b5) a gallium nitride substrate having a first main surface and a the second main surface opposite thereto, wherein the first main surface is an M-plane, oxygen concentration is $4 \times 10^{18}$ cm$^{-3}$ or more, and the stacking fault density in the first main surface is 100 cm$^{-1}$ or less;
(b6) the gallium nitride substrate according to (b4) to (b5), wherein the variation of the oxygen concentration in a plane parallel to the first main surface is less than five times of the oxygen concentration;
(b7) the gallium nitride substrate according to any one of (b1) to (b6), wherein the stacking fault density is 50 cm$^{-1}$ or less;
(b8) the gallium nitride substrate according to (b7), wherein the stacking fault density is 10 cm$^{-1}$ or less;
(b9) the gallium nitride substrate according to any one of (b1) to (b8), wherein averaged basal plane dislocation density in an optional square region sizing 250 μm×250 μm in the first main surface is $1 \times 10^6$ cm$^{-2}$ or less;
(b10) the gallium nitride substrate according to any one of (b1) to (b9), wherein the area of the first main surface is 1.0 cm$^2$ or more;
(b11) the gallium nitride substrate according to any one of (b1) to (b10), wherein an angle between the growth direction of the gallium nitride crystal constituting the substrate and the <10-10> direction of the crystal is from 0 to 10°;
(b12) a manufacturing method for manufacturing a semiconductor device, comprising the step of epitaxially growing a nitride semiconductor on the gallium nitride substrate according to any one of (b1) to (b11); and
(b13) the manufacturing method according to (b12) which is a method for manufacturing a semiconductor light-emitting device.

Effect of the Invention

There is provided a non-polar or semi-polar GaN substrate having a main surface on which a nitride semiconductor crystal with low stacking fault density can be epitaxially grown, and a technology necessary for manufacturing the crystal.

BRIEF DESCRIPTION OF THE DRAWINGS

FIGS. 1A and 1B depict shapes that single crystalline substrate or composite substrates usually have, wherein
FIG. 1A is a perspective view of a circular plate,
and FIG. 1B is a perspective view of a plate that has rectangular main surfaces.

MODE FOR CARRYING OUT THE INVENTION

The surface of a nitride semiconductor single crystal is, herein, separated into a polar plane, a non-polar plane and a semi-polar plane.
The polar plane collectively means +C- and −C-planes.
The +C-plane means a surface having a normal vector of which angle to the [0001] direction is from 0 to 10°.
The −C-plane means a surface having a normal vector of which angle to the [000-1] direction is from 0 to 10°.
For the GaN single crystal, the +C-plane is a Ga polar plane and the −C-plane is a N polar plane.
The non-polar plane collectively means M- and A-planes.
The M-plane means a surface having a normal vector of which angle to the <10-10> direction is from 0 to 10°.
The A-plane means a surface having a normal vector of which angle to the <11-20> direction is from 0 to 10°.
The semi-polar plane means a surface that corresponds to neither the polar plane nor the non-polar plane. The semi-polar planes include, but are not limited to, surfaces having normal a vector parallel to a direction selected from <30-31> direction, <30-3-1> direction, <20-21> direction, <20-2-1> direction, <20-1-1> direction, <10-11> direction, <10-1-1> direction, <10-12> direction, <10-1-2> direction, <10-13> direction, <10-1-3> direction, <11-21> direction, <11-2-1> direction, <11-22> direction, <11-2-2> direction, <11-23> direction and <11-2-3> direction.

Figure 1A:
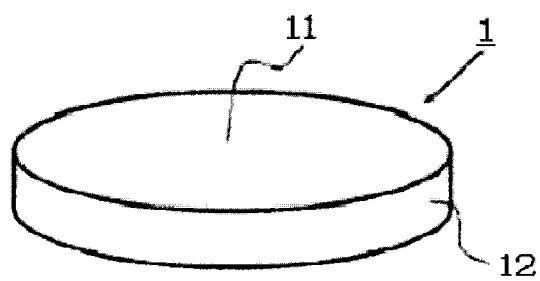
Figure 1B:
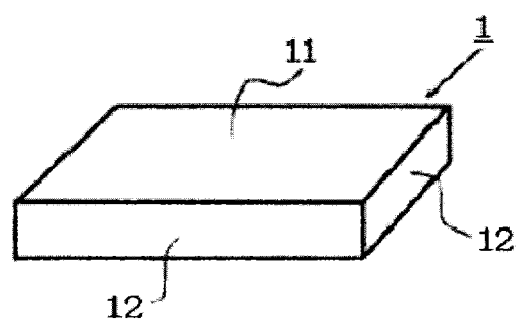

FIGS. 1A and 1B depict shapes which single crystalline substrates such as a GaN substrate and a sapphire substrate, and composite substrates such as a GaN template usually have.

In FIG. 1A, the shape of the substrate 1 is a circular plate, i.e. a plate having circular main surfaces. In FIG. 1B, the substrate 1 is a plate having rectangular main surfaces. In respective examples of FIGS. 1A and 1B, the substrate 1 has two main surfaces 11 parallel to each other and an edge surface 12. Chamfering can be performed, as necessary, for smoothening the boundary between the main surfaces 11 and the edge surface 12. In addition, although not formed in the each example of FIGS. 1A and 1B, an orientation flat to indicate the crystal orientation and an index flat to distinguish the two sides can be formed as necessary on the substrate.

The non-polar GaN substrate means, herein, a GaN substrate having main surface which is non-polar plane. In addition, the semi-polar GaN substrate means a GaN substrate having main surface which is semi-polar plane.

The M-plane GaN substrate mentioned herein means a GaN substrate having main surface which is the M-plane. Accordingly, the M-plane substrates include an on-axis substrate having a normal line of the main surface of which the angle to the <1-100> direction of the GaN crystal is 0° and an off-angle substrate having a normal line of the main surfaces of which the angle to the <1-100> direction of the GaN is 10° or less.

The C-plane GaN substrate mentioned herein means a GaN substrate having main surface which is the C-plane. Accordingly, the C-plane substrates include an on-axis substrate having a normal line of the main surface of which the angle to the [0001] direction of the GaN crystal is 0° and an off-angle substrate having a normal line of the main surface of which the angle to the [0001] direction of the GaN is 10° or less.

One of the main surfaces of the C-plane GaN substrate is the +C-plane and the other is the −C-plane due to intrinsic properties of the GaN crystal.

[1] First Aspect

1. Non-Polar or Semi-Polar GaN Substrate

According to the first aspect of the present invention, there is provided a non-polar or semi-polar GaN substrate having a first main surface and a second main surface opposite thereto, wherein the first main surface is a non-polar or a semi-polar plane, and averaged basal plane dislocation density in an optional square region sizing 250 μm×250 μm in the first main plan is $1 \times 10^6$ cm$^{-2}$ or less (Embodiment 1).

However, when a damaged region with high fault density in the outer edge of the first main surface is formed due to machine processing, the basal plane dislocation density of the first main surface is calculated after excluding such a damaged region (the same is true when the basal plane dislocation density of the first main surface is mentioned hereinafter).

Basal plane dislocation density can be measured by a transmission electron microscope (TEM), SEM-CL method (a method combining a scanning electron microscope and cathode luminescence), a method which uses an AFM or an optical microscope to observe pits formed by etching a sample surface, etc.

In the non-polar or semi-polar GaN substrate according to Embodiment 1, basal plane dislocation density averaged over the whole of the first main surface is preferably $7 \times 10^5$ cm$^{-2}$ or less, $5 \times 10^5$ cm$^{-2}$ or less, $2 \times 10^5$ cm$^{-2}$ or less, $1 \times 10^5$ cm$^{-2}$ or less, $1 \times 10^4$ cm$^{-2}$ or less, $1 \times 10^3$ cm$^{-2}$ or less, and 10 cm$^{-2}$ or less, and even 0 cm$^{-2}$.

When the basal plane dislocation density averaged over the whole of the first main surface is $1 \times 10^4$ cm$^{-2}$ or less, averaged basal plane dislocation density in an optional square region sizing 250 μm×250 μm in the first main surface is preferably $1 \times 10^4$ cm$^{-2}$ or less.

In the non-polar or semi-polar GaN substrate according to Embodiment 1, the basal plane dislocation density averaged over the whole of the first main surface is preferably 10 cm$^{-1}$ or less, more preferably 5 cm$^{-1}$ or less, and even preferably 1 cm$^{-1}$ or less. The stacking fault appeared in the main surface of the substrate propagates to a nitride semiconductor crystal epitaxially grown on the main surface.

The stacking fault density of non-polar or semi-polar GaN substrate can be evaluated by low temperature cathode luminescence (LTCL) method with a sample cooled by liquid nitrogen. By room temperature cathode luminescence method, the stacking fault density cannot be evaluated.

In the non-polar or semi-polar GaN substrate according to Embodiment 1, the basal plane dislocation density of the second main surface opposite to the first main surface is not particularly limited.

The GaN substrate according to Embodiment 1 may contain non-metal elements in the first or second period of the periodic table, other than nitrogen (N) and noble gas elements (He and Ne), i.e. hydrogen (H), carbon (C), oxygen (O) and fluorine (F). The sum of the concentrations of these elements may exceed $1 \times 10^{17}$ cm$^{-3}$, but is desirably $1 \times 10^{20}$ cm$^{-3}$ or less.

The GaN substrate according to Embodiment 1 may contain silicon (Si), of which the concentration may be $1 \times 10^{17}$ cm$^{-3}$ or more, and even $5 \times 10^{17}$ cm$^{-3}$ or more. The silicon concentration of the GaN substrate according to Embodiment 1 is preferably $1 \times 10^{19}$ cm$^{-3}$ or less.

For the GaN substrate according to Embodiment 1, alkali metal concentration is preferably low. The alkali metal concentration of the GaN substrate according to Embodiment 1 is preferably $1 \times 10^{17}$ cm$^{-3}$ or less, $5 \times 10^{16}$ cm$^{-3}$ or less, $1 \times 10^{16}$ cm$^{-3}$ or less, and even $1 \times 10^{15}$ cm$^{-3}$ or less.

The GaN substrate according to Embodiment 1 may contain a point defect.

In the GaN substrate according to Embodiment 1, the area of the first main surface is usually 1 cm$^2$ or more, preferably 2 cm$^2$ or more, more preferably 5 cm$^2$ or more, and may be 10 cm$^2$ or more.

2. Manufacturing Method of Non-Polar or Semi-Polar GaN Substrate

The GaN substrate according to Embodiment 1 can be manufactured by a procedure including, but not limited to, the followings:

(i) using a C-plane GaN template as seed to grow a GaN crystal by the HVPE method and processing the GaN crystal to fabricate a C-plane GaN substrate (primary substrate);

(ii) using the primary substrate as a seed to grow a GaN crystal by the ammonothermal method and processing the GaN crystal to fabricate an M-plane GaN substrate (secondary substrate); and (iii) using the secondary substrate as a seed to grow a GaN crystal by the ammonothermal method and processing the GaN crystal to fabricate a non-polar or semi-polar GaN substrate (the GaN substrate according to Embodiment 1).

Each step will now be detailed.

2.1 Fabrication of Primary Substrate (C-Plane GaN Substrate)

The GaN crystal for the primary substrate is grown by the HVPE method, using a C-plane GaN template as a seed, the template having a surface of GaN layer on which a mask pattern for selective growth has previously formed.

The C-plane GaN template is a composite substrate having a single crystalline GaN layer c-axis-grown on one of the main surfaces of a base material which is a crystalline substrate with a chemical composition different from GaN. The surface of the single crystalline GaN layer is the +C-plane of GaN.

The base material of the C-plane GaN template is a sapphire substrate, a SiC substrate, a Si substrate, a $Ga_2O_3$ substrate, an AlN substrate, etc. The single crystalline GaN layer is formed by the MOCVD method, and the layer thickness is, for example, from 0.5 to 100 μm.

The mask pattern is formed from a material which prohibits the vapor phase growth of GaN, such as silicon nitrides ($SiN_x$) and silicon oxide ($SiO_2$).

A preferable example of the mask pattern is a stripe pattern (line-and-space pattern). The line width (mask width) in the stripe pattern can be from 20 μm to 100 μm, and the space from 200 μm to 3000 μm. The direction of the stripe is oriented parallel to the m-axis of the single crystalline GaN layer.

Figure 2:
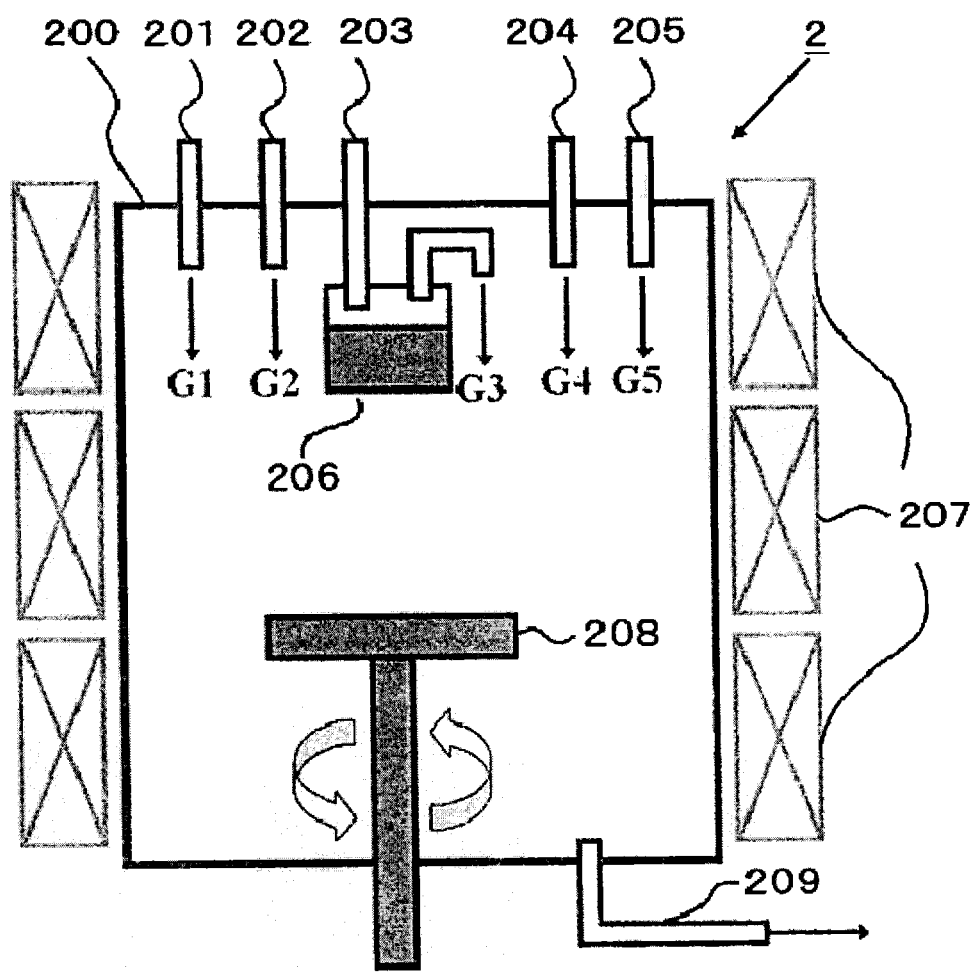
FIG. 2 is a conceptual diagram of crystal growth apparatus used in the HVPE method.

The growth of the GaN crystal by the HVPE method can be performed by using apparatus of which conceptual diagram is depicted in FIG. 2.

The crystal growth apparatus 2 depicted in FIG. 2 is equipped with a growth furnace 200, introduction tubes 201 to 205 for introducing gases into the growth furnace, a reservoir 206 for holding metallic gallium, a heater 207 disposed in such a way that it surrounds the growth furnace, a susceptor 208 for being surmounted by a seed substrate, an exhaust tube 209 for exhausting the gasses out of a growth furnace.

The growth furnace 200, the introduction tubes 201 to 205, the reservoir 206 and the exhaust tube 209 are preferably made of quartz. The susceptor 208 is preferably made from carbon, and in particular, the surface thereof is preferably coated with SiC.

Gasses G1, G2, G4 and G5 introduced via the introduction tube 201, 202, 204 and 205 into the growth furnace 200 are ammonia ($NH_3$), carrier gas, shielding gas, doping gas, and so on. Hydrogen chloride (HCl) fed via the introduction tube 203 into the reservoir 206 reacts with metallic gallium held by the reservoir and generates gaseous gallium chloride (GaCl). As HCl is usually diluted with the carrier gas before being fed into the reservoir 206, the gas G3 introduced via the reservoir into the growth furnace contains GaCl, HCl and the carrier gas.

Gasses preferably used as the carrier gas or the shielding gas are hydrogen gas ($H_2$) and nitrogen gas ($N_2$).

GaN generated by the reaction of GaCl with $NH_3$ in the growth furnace 200 is epitaxially grown on the seed substrate.

Substrate temperature during the crystal growth can be appropriately adjusted preferably within the range from 900 to 1200° C.

Pressure in the growth furnace during the crystal growth can be appropriately adjusted preferably within the range from 50 to 120 kPa.

The susceptor 208 is preferably rotated so that the crystal is grown uniformly on the seed substrate. The rotational rate can be, for example, from 1 to 50 rpm.

Crystal growth rate can be adjusted, for example, within the range from 80 to 300 μm/h. The partial pressure of GaCl or $NH_3$ or both can be increased to increase the growth rate. The GaCl partial pressure is preferably from $2\times10^2$ to $2\times10^3$ Pa. The $NH_3$ partial pressure is preferably from $4\times10^3$ to $1\times10^4$ Pa.

The partial pressure of a gas mentioned here means a value (P×r) which is a pressure (P) in a growth furnace multiplied by the ratio (r) of a volumetric flow rate of the gas to the sum of those of all the gasses fed into the growth furnace. The same is true when the gas partial pressure in the growth furnace in the HVPE method is mentioned hereinafter.

After processing the outer shape of the bulk GaN crystal grown by the HVPE method into an appropriately shape, necessary processings, such as slicing processing, removal of a damaged layer by surface etching and planarization of the main surface are performed to fabricate a C-plane GaN substrate. The −C-plane (N-polar plane) to be used for epitaxial growth at the next step is finished by CMP (Chemical Mechanical Polishing).

2.2 Fabrication of Secondary Substrate (M-Plane GaN Substrate)

A GaN crystal for the secondary substrate is grown by using the primary substrate (C-plane GaN substrate) as a seed by the ammonothermal method. Prior to the growth step, a mask pattern for selective growth is formed on the −C-plane (N-polar plane) of the primary substrate.

On the mask pattern, a line-shaped opening of about 100 μm in width is formed, which is oriented parallel to the a-axis of GaN. The mask is formed of a metal insolvable or indecomposable during the GaN crystal growth by the ammonothermal method, for example, Al, W, Mo, Ti, Pt, Ir, Ag, Au, Ta, Ru, Nb, Pd, and the alloy thereof.

A feedstock for GaN to be grown on the seed is preferably, but not limited to, polycrystalline GaN, but it may contain metallic gallium (zero-valent gallium). Usable polycrystalline GaN is the one that is manufactured by a method for reacting metallic gallium, gallium oxide, gallium hydroxide, etc. with ammonia, or reacting metallic gallium with nitrogen under a high temperature and pressure condition. The concentration of oxygen contained as a impurity in polycrystalline GaN is usually $5\times10^{20}$ cm$^{-3}$ or less, preferably $1\times10^{20}$ cm$^{-3}$, or less, and more preferably $5\times10^{19}$ cm$^{-3}$ or less.

The amounts of impuritys, such as water and oxygen, contained in ammonia used as a solvent are preferably 10 ppm or less, more preferably 0.1 ppm or less.

A mineralizer containing halogen elements, such as ammonium halide, gallium halide, and hydrogen halide can be preferably used. The purity of the mineralizer is preferably 99% or more, more preferably 99.99% or more.

Figure 3:
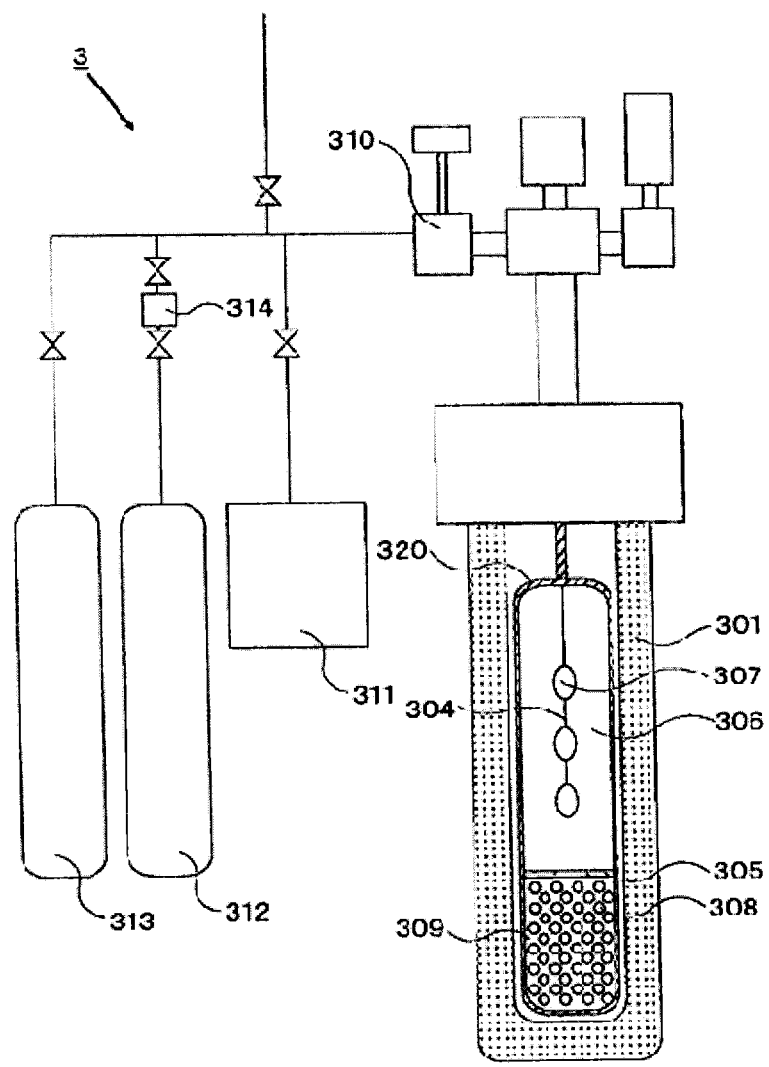
FIG. 3 is a conceptual diagram of a crystal growth apparatus used in the ammonothermal method.

The GaN crystal growth by the ammonothermal method can be performed with the apparatus explained by the conceptual diagram depicted in FIG. 3.

In the crystal growth apparatus 3 depicted in FIG. 3, the crystal growth is performed in a cylindrical growth vessel 320 loaded into a cylindrical autoclave 301. The growth vessel 320 has a crystal growth zone 306 and a feed stock dissolution zone 309 which are divided from one another by a baffle 305 therein. A seed crystal 307 is set suspended by a platinum wire 304 in the crystal growth zone 306. A feedstock 308 is loaded into the feedstock dissolution zone 309.

Gas supply lines connected to a vacuum pump 311, an ammonia tank 312 and a nitrogen tank 313 are connected via a valve 310 to the autoclave 301. During charging the growth vessel 320 with ammonia, a mass flow meter 314 can be used to confirm the amount of ammonia fed from the ammonia tank 312.

During the crystal growth, the growth vessel 320 encapsulating the seed crystal, the feedstock, the mineralizer and the solvent is loaded into the autoclave 301, and in addition, the space between the autoclave 301 and the growth vessel 320 is filled with the solvent, and then, the autoclave 301 is sealed. Then, the whole of the autoclave 301 is heated by a heater (not depicted) until an ultra-critical or sub-critical state is achieved in the growth vessel 320.

Pressure in the growth vessel 320 during the crystal growth is usually 120 MPa or more, preferably 150 MPa or more, more preferably 180 MPa or more, and usually 700 MPa or less, preferably 500 MPa or less, more preferably 350 MPa or less, and may be even 300 MPa or less.

Temperature in the growth vessel 320 during the crystal growth is usually 500° C. or more, preferably 515° C. or more, more preferably 530° C. or more, and usually 700° C. or less, preferably 650° C. or less, more preferably 630° C. or less.

Temperature in the feedstock dissolution zone 309 is higher than that in the crystal growth zone 306. The temperature difference between the feedstock dissolution zone and the crystal growth zone is preferably 5° C. or more, more preferably 10° C. or more, and preferably 100° C. or less, more preferably 80° C. or less.

Figure 4:
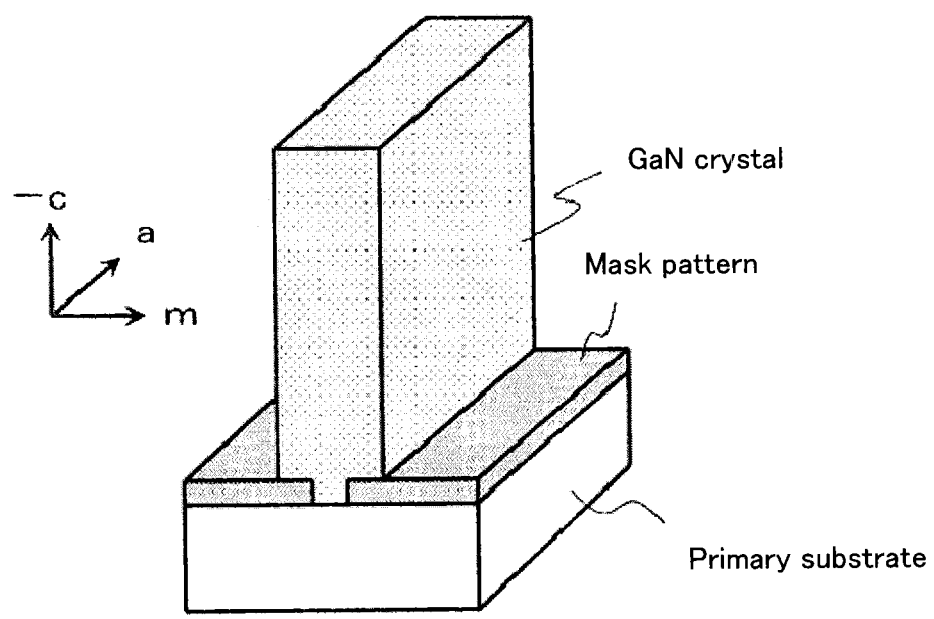
FIG. 4 is a schematic diagram illustrating the growth of a GaN crystal on the −C-plane (N polar plane) of a C-plane GaN substrate on which a mask pattern having a line-shaped opening is formed.

On the −C-plane of the primary substrate, as schematically depicted in FIG. 4, a plate-like GaN crystal of which thickness direction is the m-axis direction is grown from the opening of the mask pattern.

The secondary substrate (M-plane GaN substrate) is cut out of this GaN crystal. The main surface to be used for epitaxial growth at the next step is planarized by lapping and subsequent CMP. In order to completely remove by CMP a damaged layer introduced by slicing processing and lapping, cross-sectional SEM-CL observation of a GaN crystal sliced and lapped under the same condition is performed, and the approximate thickness of the damaged layer to be removed is previously examined, which thickness is taken into account to determine the amount to be removed by CMP.

2.3 Fabrication of Non-Polar or Semi-Polar GaN Substrate

The GaN crystal is grown by the ammonothermal method by using the secondary substrate (M-plane GaN substrate) as a seed.

A feedstock, a solvent and mineralizers preferably used in the ammonothermal method are the same as those for growing the GaN crystal of the secondary substrate. Available crystal growth apparatus and a preferable condition during the crystal growth are also the same as those for growing the GaN crystal of the secondary substrate.

A non-polar or semi-polar GaN substrate according to Embodiment 1 is cut out of the GaN crystal grown on the secondary substrate. Slicing the crystal in parallel to the main surface of the secondary substrate can provide an M-plane GaN substrate. Slicing in other directions can provide GaN substrates having a non-polar plane or various semi-polar planes as a main surface other than the M-plane.

After the slicing processing, at least one main surface is lapped and subsequently planarized by CMP. In order to completely remove by CMP a damaged layer introduced by slicing processing and lapping, cross-sectional SEM-CL observation of a GaN crystal sliced and lapped under the same condition is performed, and the approximate thickness of the damaged layer to be removed is previously examined, which thickness is taken into account to determine the amount to be removed by CMP.

3. Use Application of Non-Polar or Semi-Polar GaN Substrate

On the first main surface with low basal plane dislocation density of the GaN substrate according to Embodiment 1, a nitride semiconductor crystal with low stacking fault density and high quality can be formed by epitaxial growth.

The non-polar or semi-polar GaN substrate according to Embodiment 1 and the nitride semiconductor layer grown directly on the first main surface of the substrate preferably satisfy the condition of lattice mismatch represented by the following formula (1):

$$2|a_1-a_2|/[a_1+a_2] \leq 1\times 10^{-3} \qquad (1),$$

where $a_1$ and $a_2$ are lattice constants of crystal axises parallel to the first main surface, of GaN and the nitride semiconductor layer, respectively.

The lattice mismatch is preferably $5\times 10^{-4}$ or less, more preferably $1\times 10^{-4}$ or less, and in particular, preferably $1\times 10^{-5}$ or less.

Various semiconductor device structures can be formed on the first main surface of the GaN substrate according to Embodiment 1 by the epitaxial growth of nitride semiconductor. Specific examples include light emitting devices such as light-emitting diodes, and laser diodes; electron devices such as rectifiers, bipolar transistors, field effect transistors, and HEMTs (High Electron Mobility Transistors); semiconductor sensors such as temperature sensors, pressure sensors, radiation sensors, and visible-ultraviolet photodetectors; SAW (Surface Acoustic Wave) devices, vibrators, resonators, oscillators, MEMS (Micro Electro Mechanical System) elements, and voltage actuators.

A bulk GaN crystal can also be epitaxially grown on the first main surface of the GaN substrate according to Embodiment 1. In other word, the GaN substrate according to Embodiment 1 can be used as a seed for the growth of bulk GaN.

[2] Second Aspect

1. M-Plane GaN Substrate

According to the second aspect of the present invention, there is provided an M-plane GaN substrate having a first main surface and a second main surface opposite thereto, wherein the first main surface is an M-plane, and the carrier density is $3\times 10^{18}$ cm$^{-3}$ or more, and stacking fault density in the first main surface is 100 cm$^{-1}$ or less (Embodiment 2a).

According to the second aspect of the present invention, there is also provided an M-plane GaN substrate having a first main surface and a second main surface opposite thereto, wherein the first main surface is a M-plane, and n-type impurity concentration is more than $4\times 10^{18}$ cm$^{-3}$ or more, stacking fault density in the first main surface is 100 cm$^{-1}$ or less (Embodiment 2b).

Hereinafter, "Embodiment 2" may collectively mean Embodiments 2a and 2b.

In the above described Embodiment 2, the stacking fault density in the first main surface means stacking fault density averaged over the whole of the first main surface. However, when a damaged region with high fault density due to machine processing is formed in the outer edge of the first main surface, the stacking fault density of the first main surface is calculated after excluding the damaged region (hereinafter, the same is true when the stacking fault density of the first main surface is mentioned).

When the carrier density of the GaN substrate is $3\times 10^{18}$ cm$^{-3}$ or more, an electrode with low contact resistance can be readily formed on the surface thereof. When the carrier density of the GaN substrate is $4\times10^{18}$ cm$^{-3}$ or more, and even $5\times10^{18}$ cm$^{-3}$ or more, the electrode with low contact resistance can be more readily formed on the surface.

Although no upper limit exists for the carrier density of the M-plane GaN substrate according to Embodiment 2, the density beyond $1\times10^{"}$ cm$^{-3}$ tends to saturate the reduction effect of the contact resistance to the electrode. For example, in use application to light emitting devices, carrier density beyond $5\times10^{19}$ cm$^{-3}$ is rarely required for the GaN substrate.

Elements capable of being added to GaN as impuritys can be appropriately referenced in the well-known art and preferably include, but are not limited to, oxygen (O) and silicon (Si). Only one of oxygen and silicon, or both may be used.

In order to obtain a carrier density of $3\times10^{18}$ cm$^{-3}$ or more by using oxygen as a impurity, an oxygen concentration of $4\times10^{18}$ cm$^{-3}$ or more is desirable.

The impurity concentration in the GaN substrate can be measured by SIMS (secondary ion mass spectroscopy), and the carrier density can be measured by Raman spectroscopy.

Since the M-plane GaN substrate according to Embodiment 2 has a low stacking fault density of 100 cm$^{-1}$ or less in the first main surface, a nitride semiconductor film with high quality can be epitaxially grown on the first main surface by MOCVD (metal organic chemical vapor deposition) method or MBE (molecular beam epitaxy) method.

The stacking fault density in the first main surface is preferably 50 cm$^{-1}$ or less, more preferably 10 cm$^{-1}$ or less.

The stacking fault density in the M-plane GaN substrate can be evaluated by low temperature cathode luminescence (LTCL) measurement with a sample cooled by liquid nitrogen. The stacking fault density cannot be evaluated by room temperature cathode luminescence measurement.

2. Manufacturing Method of M-Plane GaN Substrate

The M-plane GaN substrate according to Embodiment 2 can be manufactured from the GaN crystal grown by the HVPE method by using the M-plane GaN substrate according to above-mentioned Embodiment 1 as a seed.

When the GaN crystal is grown by using M-plane GaN substrate as a seed, the growth direction thereof is a direction perpendicular to the main surface (M-plane) of the substrate. The growth direction here means the thickness direction of the GaN crystal layer grown on the main surface of the substrate.

The GaN crystal uniformly doped with oxygen can be obtained by adopting a condition under which the crystal surface is a mirror surface during the growth. The reason is that under such a condition, the M-plane accounts for the entire crystal surface during the growth. In the M-plane GaN substrate cut out of the GaN crystal grown under such a condition, the variation of oxygen concentration in a surface parallel to the main surface is less than five-fold of the oxygen concentration.

In an example, a plurality of seed substrates can be placed in a tile-like arrangement on a susceptor to grow one continuous GaN crystal layer over the substrates.

When the GaN crystal is homo-epitaxially grown on the main surface of the M-plane GaN substrate, a larger off-angle of the main surface inhibits the generation of stacking fault more. Accordingly, the off-angle of the main surface of the seed substrate is preferably 2° or more, and more preferably 5° or more.

The GaN crystal growth by the HVPE method can be performed by using the crystal growth apparatus depicted in the conceptual diagram of the above-mentioned FIG. 2.

In particular, a two-stage growth method including (a) a heating step, (b) an initial growth step and (c) a main growth step, which are to be described hereinafter, in the order mentioned can be performed to obtain the GaN crystal with reduced stacking fault density.

(a) Heating Step

At the heating step, substrate temperature is raised from room temperature to $T_1$ without feeding GaCl onto the seed substrate. $T_1$ is preferably 830° C. or more, and 870° C. or less. Heating rate is preferably 12° C./min or more, and 30° C./min or less. The heating rate may be constant over the course of the heating step or changed on the way.

At the heating step, atmospheric gasses that can be introduced into the growth furnace are $H_2$, $NH_3$, $N_2$, etc., and at least both of $NH_3$ and $N_2$ are preferably introduced. The volumetric flow rate of $NH_3$ introduced into the growth furnace is preferably 15% or more of the sum of the volumetric flow rates of all the gasses introduced into the growth furnace.

(b) Initial Growth Step

At the initial growth step, the substrate temperature is raised from $T_1$ to $T_2$ during the growth of the GaN by feeding GaCl and $NH_3$ onto the substrate. $T_2$ is preferably 940° C. or more and 1050° C. or less. The heating rate is preferably 11° C./min or more and 24° C./min or less.

When the pressure in a growth furnace at the initial growth step is $1.0\times10^5$ Pa, the GaCl partial pressure is preferably $2.0\times10^2$ Pa or more and $5.0\times10^2$ Pa or less, and the $NH_3$ partial pressure is preferably $8.0\times10^3$ Pa or more and $1.2\times10^4$ Pa or less.

At the initial growth step, $N_2$ preferably accounts for 70% or more, and even 90% or more, by volumetric flow rate, of all the gasses introduced into a growth furnace. $H_2$ among the other gasses can be introduced into the growth furnace at the initial growth step.

(c) Main Growth Step

At the main growth step, the GaN crystal is grown into a thick film by feeding GaCl and $NH_3$ onto the seed substrate with substrate temperature kept to be $T_2$. The pressure in the growth furnace at the main growth step is preferably 50 kPa or more and 120 kPa or less.

When the pressure in the growth furnace at the main growth step is $1.0\times10^5$ Pa, the GaCl partial pressure is preferably $2.0\times10^2$ Pa or more and $5.0\times10^2$ Pa or less, and the $NH_3$ partial pressure is preferably $8.0\times10^3$ Pa or more and $1.5\times10^4$ Pa or less.

At the main growth step, $N_2$ preferably accounts for 70% or more, and even 90% or more, by volumetric flow rate, of all the gasses introduced into a growth furnace. $H_2$ among the other gasses can be introduced into the growth furnace at the main growth step.

Figure 5:
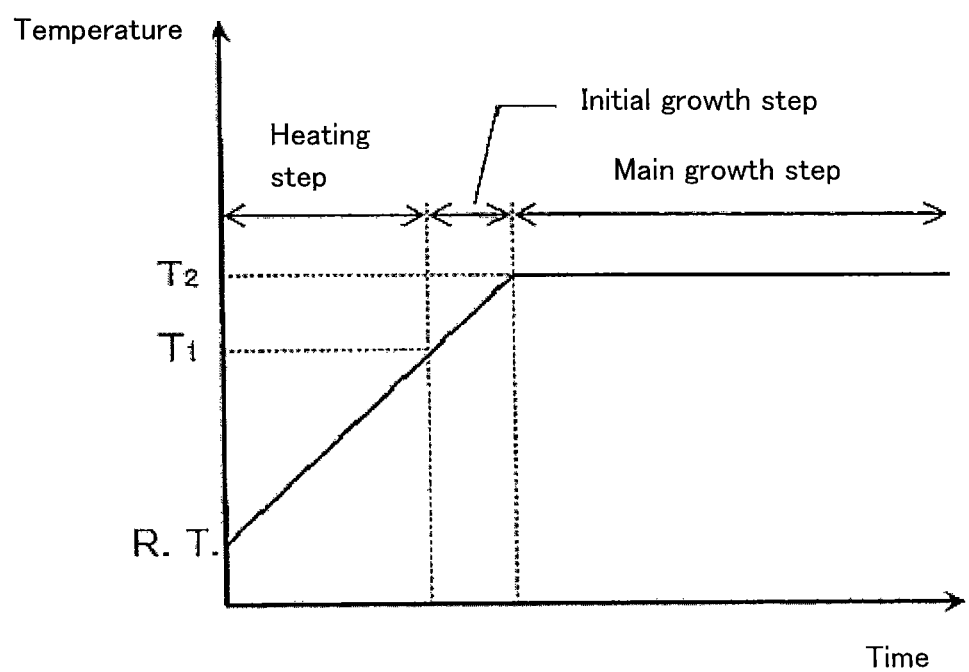
FIG. 5 is an example of temperature profile that can be adopted for a two-stage growth method.
Figure 6:
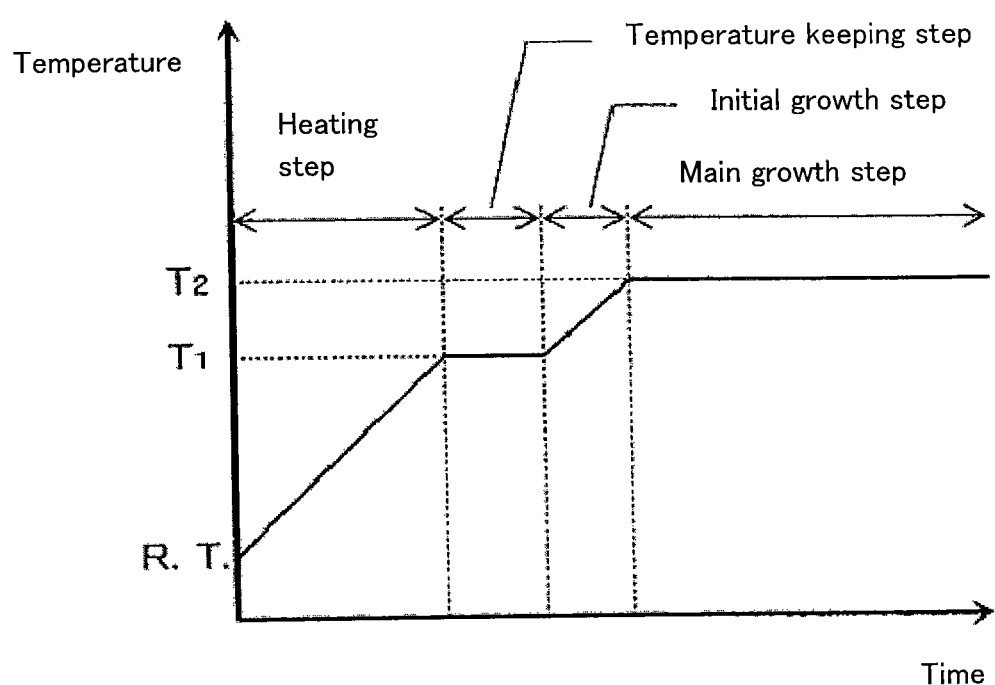
FIG. 6 is an example of temperature profile that can be adopted for a two-stage growth method.
Figure 7:
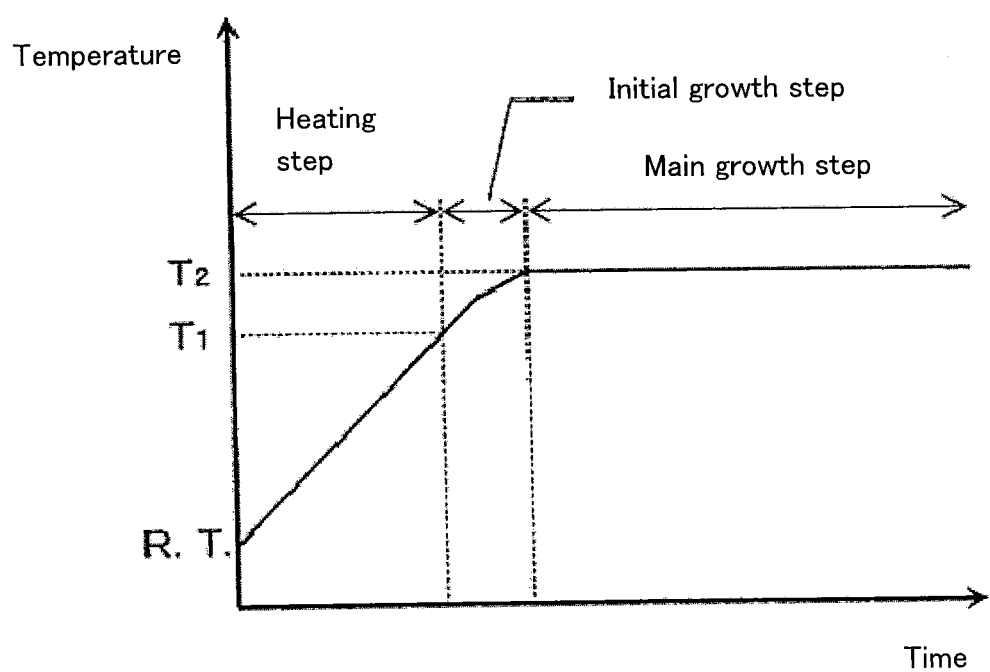
FIG. 7 is an example of temperature profile that can be adopted for a two-stage growth method.

Temperature profiles adoptable in the above described two-stage growth method are depicted in FIGS. 5 to 7.

In the example of FIG. 5, the heating rate is constant from the heating step to the initial growth step. In the example of FIG. 6, between the heating step and the initial growth step, the temperature keeping step of keeping the substrate temperature constant is provided. The period of the temperature keeping step can be appropriately set, and is, for example, one minute or more and 60 minutes or less.

In the example of FIG. 7, the heating rate is changed at the early and later stages of the initial growth step. In this example, the heating rate is changed discontinuously, but it can be changed gradually.

At the heating growth step and the main growth step, the GaN crystal can be grown with doping gasses fed.

Oxygen gas ($O_2$) or water ($H_2O$) as doping gasses for oxygen doping, and silane ($SiH_4$), disilane ($Si_2H_6$), chlorosilane ($SiH_3Cl$), dichlorosilane ($SiH_2Cl_2$), trichlorosilane (SiHCl$_3$), tetrachlorosilane (SiCl$_4$), tetrafluorosilane (SiF$_4$), etc. as doping gasses for silicon doping can be preferably used.

Instead of feeding the doping gasses, oxygen-containing gas generated from quartz members configuring crystal growth apparatus such as a growth furnace, an introduction tube, and a reservoir can be used for oxygen doping of the GaN crystal. A higher temperature of quartz member during the crystal growth leads to a greater amount of the generated oxygen-containing gas and a higher oxygen concentration in the GaN crystal. When the oxygen concentration in the GaN crystal must be kept low, the metrology described in above-mentioned Patent Document 4 (Japanese Laid-open Patent Publication No. JP-A-2012-066983) can be referenced. One example is as follows.

1) In the growth furnace, a liner tube made of pBN (pyrolytic boron nitride) is placed, inside which a seed substrate is placed, and thereby oxygen-containing gas generated from the quartz growth furnace is prevented from contacting to the seed substrate.

2) In the above described 1), high purity nitrogen gas as a shield gas flowing between the growth furnace and the liner tube can more effectively suppress the contact of the oxygen-containing gas generated from the growth furnace to the seed substrate.

3) To a susceptor surmounted by a seed substrate, a local heating mechanism is installed, which, in combination with the heater, is used to heat the seed substrate. Thus, heater output necessary for heating to a predetermined temperature can be reduced, and the temperature of the quartz members heated together with the seed substrate, such as the growth furnace, the introduction tube, the reservoir, can be lowered, and thereby the amount of the oxygen-containing gas generated from these quartz members can be suppressed.

4) Heat shielding means such as a heat shield plate can be used to inhibit heat transfer from the heater to the reservoir, thereby lowering the temperature of the reservoir, and the amount of oxygen-containing gas generated from the reservoir can be suppressed.

After processed into an appropriate outer-shape, the bulk GaN crystal grown by the above described two-stage growth method is subjected to necessary processings, such as slicing processing, removal of a damaged layer by surface etching and planarization of the main surface. At least one main surface is planarized by lapping and subsequent CMP. In order to completely remove by CMP a damaged layer introduced by slicing processing and lapping, the approximate thickness of the damaged layer to be removed is previously examined by cross-sectional SEM-CL observation of a GaN crystal sliced and lapped under the same condition, which thickness is taken into account to determine the amount to be subjected to CMP.

By the above procedure, the objective M-plane GaN substrate can be obtained.

3. Use Application of M-Plane GaN Substrate 3.1 Semiconductor Light-Emitting Device The GaN substrate according to Embodiment 2 can be preferably used for manufacturing semiconductor light-emitting devices such as light-emitting diodes (LEDs), laser diodes (LDs).

Figure 8:
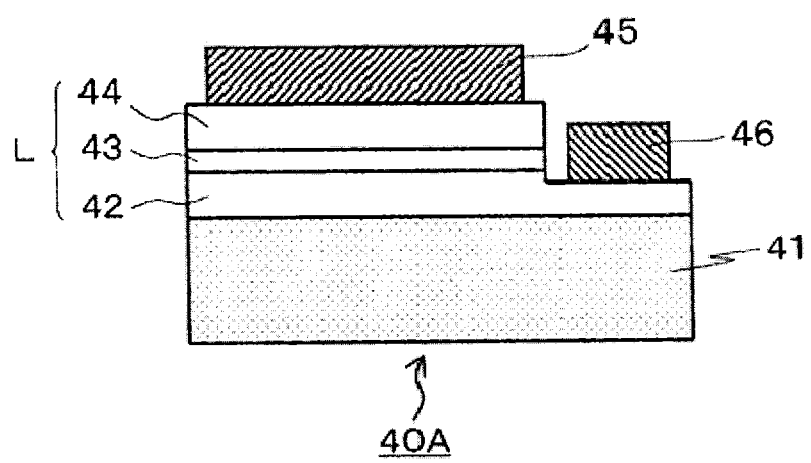
FIG. 8 is a cross-sectional view depicting an exemplary structure of a semiconductor light-emitting device that can be manufactured by using the GaN substrate.

FIG. 8 depicts an exemplary structure of a semiconductor light-emitting device capable of being manufactured by using the GaN substrate according to Embodiment 2. FIG. 8 is a cross-sectional view, and the semiconductor light-emitting device 40A has a semiconductor laminate L grown on the main surface of the GaN substrate 41 by MOVPE method (metal organic vapor phase epitaxy method). The semiconductor laminate L includes an n-type layer 42, a light-emitting layer 43 and a p-type layer 44 in the mentioned order from the side of the GaN substrate 41. The n-type layer 42 is, for example, made of GaN or AlGaN, and doped with Si. The light-emitting layer 43 is, for example, formed by stacking alternately In$_{x1}$Ga$_{1-x1}$N well layers and In$_{x2}$Ga$_{1-x2}$N ($0 \leq x_2 < x_1$) barrier layers. The p-type layer 44 is, for example, made of GaN or AlGaN, and doped with Mg.

A positive electrode 45 is formed on the top of the p-type layer 44. A negative electrode 46 is formed on the surface of the n-type layer exposed by partially etching the laminate.

Decreased stacking fault density of the GaN substrate 41 improves the quality of the semiconductor laminate L grown thereon and thereby increases the light-emitting efficiency of the semiconductor light-emitting device 40A.

Since increased n-type carrier density of the GaN substrate 41 lowers the electric resistance, and thereby the n-type layer 42 and the substrate acts as pathways of electric current, the operating voltage of the semiconductor light-emitting device 40A is lowered.

Figure 9:
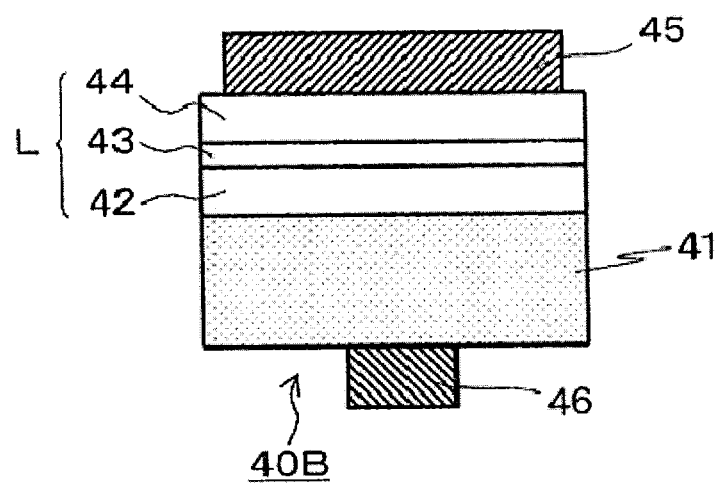
FIG. 9 is a cross-sectional view depicting an exemplary structure of a semiconductor light-emitting device that can be manufactured by using the GaN substrate.

For the semiconductor light-emitting device 40B depicted in FIG. 9 having a negative electrode 46 on the backside of the GaN substrate 41, the lowering effect of the operating voltage due to the increased carrier density of the GaN substrate 41 is more significant. The reason is that in addition to decrease in the series resistance of the device due to decrease in the electric resistance of the GaN substrate 41, the contact resistance between the negative electrode 46 and the GaN substrate 41 decreases due to the increase in the carrier density of GaN substrate 41.

3.2 GaN Layer Bonded Substrate

By using the GaN substrate according to Embodiment 2, a GaN layer bonded substrate can be manufactured.

Figure 10:
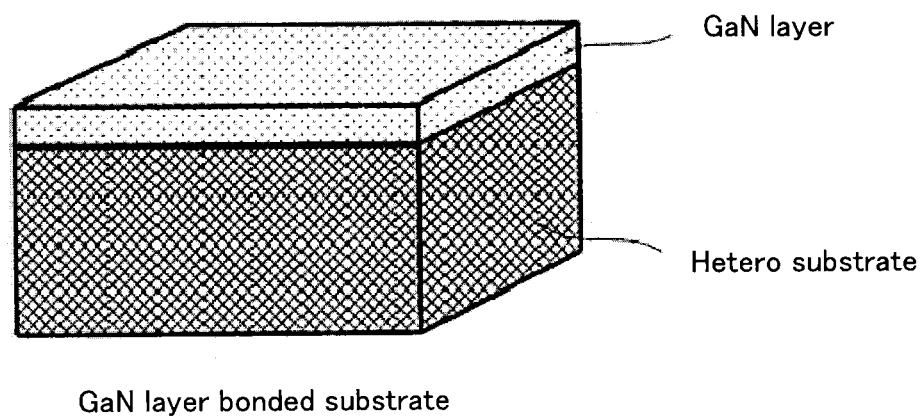
FIG. 10 is a schematic diagram for explaining a structure of a GaN layer bonded substrate.

A GaN layer bonded substrate is, as schematically depicted in FIG. 10, a composite substrate in which a GaN layer is bonded to a different-composition substrate with a chemical composition different from that of GaN, and can be used for manufacturing semiconductor devices such as light emitting devices.

The GaN layer bonded substrate can be typically manufactured by performing the first step of implanting ions into the vicinity of the main surface of the GaN substrate, the second step of bonding the main surface side of the GaN substrate to a different-composition substrate and the third step of separating the GaN substrate at the ion-implanted region serving as a boundary to form a GaN layer bonded to the different-composition substrate, in the mentioned order.

Accordingly, the GaN layer bonded substrate manufactured by using the GaN substrate according to Embodiment 2 will have a structure in which the GaN layer separated from the GaN substrate according to Embodiment 2 is bonded to the different-composition substrate.

The different-composition substrates capable of being used for the GaN layer bonded substrate are exemplified by sapphire substrates, AlN substrates, SiC substrates, ZnSe substrates, Si substrates, ZnO substrates, ZnS substrates, quartz substrates, spinel substrates, carbon substrates, diamond substrates, Ga$_2$O$_3$ substrates, ZrB$_2$ substrates, Mo substrates, W substrates, etc.

For the structure of the GaN layer bonded substrate and the manufacturing method and application thereof, Japanese Laid-open Patent Publication No. JP-A-2006-210660, Japanese Laid-open Patent Publication No. JP-A-2011-44665, and so on can be referenced.

3.3 Other Use Applications

The M-plane GaN substrate according to Embodiment 2 can be used as a substrate for manufacturing not only light emitting devices but also various semiconductor devices, for example, electron devices such as rectifiers, bipolar transistors, field effect transistors, HEMTs (High Electron Mobility Transistors), semiconductor sensors such as temperature sensors, pressure sensors, radiation sensors, and visible-ultraviolet photodetectors, SAW (Surface Acoustic Wave) devices, vibrators, resonators, oscillators, MEMS (Micro Electro Mechanical System) elements, voltage actuators, etc.

[3] Experimental Results
1. Experiment 1
(1) Preparation of Primary Substrate (C-Plane GaN Substrate)

A C-plane GaN substrate was prepared, which has a CMP finished −C-plane (N-polar plane) cut out of the GaN crystal grown by the HVPE method on the C-plane GaN template having a mask pattern formed on the main surface thereof.

(2) Fabrication of Secondary Substrate (M-Plane GaN Substrate)

The prepared primary substrate was used as a seed to grow a GaN crystal by the ammonothermal method. The specific procedure is as follows.

(i) Polycrystalline GaN was prepared, which was manufactured as a feedstock by the vapor-phase-reaction of $NH_3$ with GaCl. Ammonium fluoride ($NH_4F$) and hydrogen iodide (HI) were also prepared as mineralizers.

A mask pattern having a line-shaped opening of 100 μm width was formed by using TiW alloy on the −C-plane of the primary substrate to be used as a seed. The longitudinal direction of the opening was oriented parallel to the a-axis of GaN.

(ii) Polycrystalline GaN and $NH_4F$ were loaded into the lower part (feedstock dissolution zone) of a cylindrical growth vessel made of Pt—Ir alloy. The amount of $NH_4F$ was set so that the mole ratio of fluorine atom to $NH_3$ to be introduced later into the growth vessel was 0.5%. Then, a platinum baffle dividing the upper part (crystal growth zone) and lower part of the growth vessel was placed in the growth vessel. After the placement of the baffle, the primary substrate to be used as a seed was placed, with itself kept hung by a platinum wire, in the crystal growth zone.

(iii) A cap made of Pt—Ir with a tube was attached to the upper part of the growth vessel by welding and the tube was connected to a gas supply line. Then, after cooling the lower part of the growth vessel by liquid nitrogen, HI was introduced into the growth vessel via the tube. The amount of HI was set so that the mole ratio of iodine atom to $NH_3$ to be subsequently introduced into the growth vessel was 2%.

After introducing HI, the gas supply line was switched and $NH_3$ was introduced into the growth vessel. The amount of $NH_3$ was set to be about 55% of the effective volume of the growth vessel after conversion into the volume of liquid $NH_3$ at −33° C.

(iv) After introduction of $NH_3$, the tube was weld and cut off to seal the growth vessel, which was then inserted into cylindrical autoclave made of nickel based alloy with a valve. Then, the space between the growth vessel and the autoclave was also charged with $NH_3$ via the valve, which was then closed to seal the autoclave. The amount of $NH_3$ for charging the space was set to be about 56% of the effective volume of the growth vessel after conversion into the volume of liquid $NH_3$ at −33° C.

(v) The autoclave was heated from outside by using an electric furnace equipped with a plurality of independently controllable heaters. The heaters were controlled so that the averaged temperature of the growth vessel (averaged value of the temperatures of the crystal growth zone and the feedstock dissolution zone) was 600° C. and the temperature difference between the crystal growth zone and the feedstock dissolution zone was 20° C., and this was maintained for 30 days. In this instance, pressure inside the autoclave was 215 MPa.

(vi) 30 days later, $NH_3$ filling the space between the growth vessel and autoclave was released by opening the valve of the autoclave, and the pressure difference thereby generated between the inside and the outside of the growth vessel was used to break the growth vessel. Then, after $NH_3$ in the growth vessel was confirmed to have also been exhausted, the primary substrate was taken out.

On the −C-plane of the primary substrate taken out from the growth vessel, from the opening of the mask pattern, a plate-like GaN crystal was grown, of which the dimension in the c-axis direction was 7 mm and the thickness direction was the m-axis direction.

Out of this GaN crystal, an M-plane substrate (secondary substrate) was cut, which had rectangular main surfaces having longer sides parallel to the a-axis and shorter sides parallel to the c-axis, and a size of 35 mm (length)×7 mm (width)×330 μm (thickness). Both of the main surfaces were subjected to lapping and CMP processing, and a damaged layer formed by slicing was completely removed.

(3) Fabrication of Tertiary Substrate (M-Plane GaN Substrate)

A GaN crystal was grown by the ammonothermal method by using the secondary substrate fabricated in the above described procedure (M-plane GaN substrate) as a seed.

Except that the seed was different, additive amounts of the mineralizers were changed so that the mole ratios of fluorine and iodine atoms to $NH_3$ were 0.5% and 1.5%, respectively, and the crystal growth time period was 20 days, the GaN crystal for the tertiary substrate was grown in the same procedure as that of the GaN crystal growth for the secondary substrate.

The size of the GaN crystal obtained after the growth for 20 days was 40 mm (a-axis direction)×10 mm (c-axis direction)×6 mm (m-axis direction).

Out of this GaN crystal, an M-plane substrate with an off-angle (tertiary substrate) was cut, which had rectangular main surfaces having longer sides parallel to the a-axis and shorter sides parallel to the c-axis, and a size of 17 mm (length)×8 mm (width)×330 μm (thickness). The off-angle was set to be −2° in the [0001] direction, and within +0.1° in the [−12-10] direction. Both of the main surfaces were subjected to lapping and CMP processing, and a damaged layer formed by slicing was completely removed.

SIMS analysis of the M-plane GaN substrate determined hydrogen concentration to be $1.4×10^{19}$ $cm^{-3}$, oxygen concentration $8.7×10^{18}$ $cm^{-3}$ and fluorine concentration $7×10^{17}$ $cm^{-3}$. Analysis by the room-temperature cathode luminescence method (3 kV, 100 pA, 1000-fold magnification) did not detect basal plane dislocation. Analysis by the low-temperature cathode luminescence method (10 kV, 4 nA, field of view at 200-fold magnification, sample temperature 82K) determined the stacking fault density of the substrate to be 0 $cm^{-1}$.

In these measurements, observed regions per field of view were 90 μm×120 μm for field of view at 1000-fold magnification and 600 μm×400 μm for field of view at 200-fold magnification.

(4) GaN Crystal Growth by the HVPE Method

A GaN crystal was grown by the HVPE method by using the tertiary substrate fabricated in the above described procedure (M-plane GaN substrate) as a seed.

For the GaN crystal growth, the above-mentioned two-stage growth method was used. In other words, the susceptor placed in the growth furnace was surmounted by the seed substrate so that one main surface of the substrate turned up, and then, the substrate temperature was raised up to 850° C. with only $N_2$ and $NH_3$ initially fed onto the seed substrate (heating step), and the temperature was kept for 15 minutes.

Then, feeding GaCl onto the seed substrate was initiated by feeding HCl diluted with $N_2$ into the reservoir heated to 800° C. which holded metallic gallium, and the substrate temperature was raised at a rate of 21° C./min (initial growth step).

After the substrate temperature reached 950° C., the substrate temperature was kept constant while GaN crystal was grown for 20 hours by feeding GaCl and $NH_3$ onto the seed substrate (main growth step).

From the start of the heating step to the end of the main growth step, the pressure in the growth furnace was controlled to be $1.0 \times 10^5$ Pa, the GaCl partial pressure $3.1 \times 10^2$ Pa and the ammonia partial pressure $9.8 \times 10^3$ Pa. For carrier gasses, $N_2$ and $H_2$ were used, and the ratio of $N_2$ was set so as to account for 48% of the sum of volumetric flow rates of all the gasses fed into the growth furnace.

The grown GaN crystal covered a main surface of the tertiary substrate like a film, and the thickness was about 0.8 mm.

Analysis of the as-grown GaN crystal film by the room-temperature cathode luminescence method (3 kV, 100 pA, 1000-fold magnification) determined basal plane dislocation density to be $9.4 \times 10^5$ cm$^{-2}$.

Analysis of the as-grown GaN crystal film by the low-temperature cathode luminescence method (acceleration voltage 5 kV, electric current 500 pA, field of view at 200-fold magnification, sample temperature 82K) did not detect stacking fault.

Oxygen concentration measured by SIMS analysis of the as-grown GaN crystal film was $4.0 \times 10^{18}$ cm$^{-3}$, and carrier density in the vicinity of the main surface measured by Raman spectroscopy was $2.5 \times 10^{18}$ cm$^{-3}$.

This oxygen concentration value was lower than the oxygen concentration of the tertiary substrate used as a seed ($8.7 \times 10^{18}$ cm$^{-3}$), and the difference was $4.7 \times 10^{18}$ cm$^{-3}$.

Oxygen contained in the GaN crystal film was attributed to oxygen compounds such as $H_2O$ incorporated into the feedstock, or to quartz members configuring the vapor phase epitaxy apparatus.

2. Experiment 2
(1) Fabrication of Primary Substrate (C-Plane GaN Substrate)

A C-plane GaN template having a single crystalline GaN layer grown on a C-plane sapphire substrate was prepared, and a mask pattern was formed on the surface of the GaN layer by using a silicon nitride film of 80 nm thickness. Plasma CVD method was used for the formation of the silicon nitride film, and photo-lithography and dry etching techniques were used for the patterning.

The mask pattern was configured to be a stripe pattern (line-and-space pattern) of 850 μm pitch with 50 μm line width (mask width) and 800 μm space width, and the stripe was oriented parallel to the direction of the m-axis of the single crystalline GaN layer.

On the C-plane GaN template with the above described mask pattern formed, an undoped GaN crystal was grown by the HVPE method. For 15 minutes from the start of the growth, the substrate temperature was kept to be 970° C., and then, raised to 1020° C. while the growth was continued. The pressure in the growth furnace during the growth was controlled to be $1.0 \times 10^5$ Pa, the GaCl partial pressure $7.4 \times 10^2$ Pa, and the ammonia partial pressure $1.1 \times 10^4$ Pa. The growth time was set to be 55 hours.

A C-plane substrate (primary substrate) of 330 μm thickness was cut out of the thus grown GaN crystal. The –C-plane was subjected to lapping and CMP processing to completely remove a damaged layer formed by slicing.

(2) Fabrication of Secondary Substrate (M-Plane Substrate)

After a mask pattern having a line-shaped opening of 100 μm width parallel to the a-axis of GaN is formed with TiW alloy on the –C-plane of the C-plane GaN substrate fabricated by the above described procedure, a GaN crystal was grown by an ammonothermal method by using the C-plane GaN substrate as a seed.

The growth of the GaN crystal by the ammonothermal method and the fabrication of the tertiary substrate (M-plane substrate) from the GaN crystal were performed in the same manner as the method described in (2) of the Experiment 1 except that the additive amounts of the mineralizers were changed so that the mole ratios of fluorine and iodine atoms to ammonia were 0.5% and 0.75%, respectively, and the crystal growth time period was changed to 43 days.

Out of this GaN crystal, an M-plane substrate (secondary substrate) was cut, which had rectangular main surfaces having longer sides parallel to the a-axis and shorter sides parallel to the c-axis, and s size of 27 mm (length)×10 mm (width)×470 μm (thickness). Both of the main surfaces were subjected to lapping and CMP processing, and a damaged layer formed by slicing was completely removed.

(3) Fabrication of Tertiary Substrate (M-Plane GaN Substrate)

A GaN crystal was grown by the ammonothermal method by using the secondary substrate fabricated in the above described procedure (M-plane GaN substrate) as a seed. Except that a different seed was used, the additive amounts of the mineralizers were changed so that mole ratios of fluorine and iodine atoms to ammonia was 0.5% and 1.5%, respectively, and the crystal growth time period was 16 days, the GaN crystal for the tertiary substrate was grown in the same procedure as that of the GaN crystal growth for the secondary substrate.

The size of GaN crystal obtained after the growth was 32 mm (a-axis direction)×12 mm (c-axis direction)×6 mm (m-axis direction).

Out of this GaN crystal, an M-plane substrate with an off-angle (tertiary substrate) was cut, which had rectangular main surfaces having longer sides parallel to the a-axis and shorter sides parallel to the c-axis, and a size of 27 mm (length)×7 mm (width)×330 μm (thickness). The off-angle was set to be −2° in the direction, and within +0.1° in the [−12-10] direction. Both of the main surfaces were subjected to lapping and CMP processing, and a damaged layer formed by slicing was completely removed.

SIMS analysis of the M-plane GaN substrate determined oxygen concentration to be $2.3 \times 10^{18}$ cm$^{-3}$. Analysis by the room-temperature cathode luminescence method (3 kV, 100 pA, 1000-fold magnification) did not detect basal plane dislocation. Analysis by the low-temperature cathode luminescence method (10 kV, 4 nA, field of view at 200-fold magnification, sample temperature 82K) determined the stacking fault density of the substrate to be 0 cm$^{-1}$.

(4) GaN Crystal Growth by HVPE Method

A GaN crystal was grown by the HVPE method by using the tertiary substrate fabricated in the above described procedure (M-plane GaN substrate) as a seed.

Figure 11:
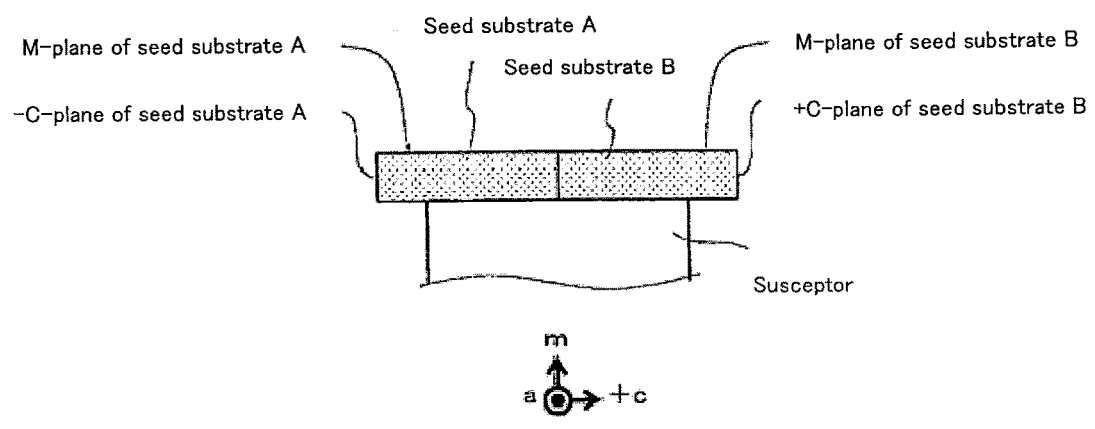
FIG. 11 is a cross-sectional view depicting two seed substrates arranged on a susceptor.

In this example, the susceptor was surmounted by two seed substrates which were arranged so that, as depicted in the cross-sectional view of FIG. 11, the C-plane of the one substrate butted −C-plane of the other. The angle between the a-axises of the respective seed substrates, when the susceptor was seen from above, was set to be within 0.5°.

In the GaN crystal growth, the above-mentioned two-stage growth method was used. In other words, the seed substrate was placed in the growth furnace, and then, the substrate temperature was raised up to 850° C. with only $N_2$ and $NH_3$ initially fed onto the seed substrate (heating step), and the temperature was kept for 15 minutes.

Then, feeding GaCl onto the seed substrate was initiated by feeding HCl diluted with $N_2$ into the reservoir heated to 800° C. which holded metallic gallium, and the substrate temperature was raised at a rate of 21° C./min (initial growth step).

After the substrate temperature reached 950° C., the substrate temperature was kept constant while GaN crystal was grown for 72 hours by feeding GaCl and $NH_3$ onto the seed substrate (main growth step).

From the start of the heating step to the end of main growth step, the pressure in the growth furnace was controlled to be $1.0 \times 10^5$ Pa, the GaCl partial pressure $3.8 \times 10^2$ Pa and the ammonia partial pressure $1.2 \times 10^4$ Pa. For carrier gasses, $N_2$ and $H_2$ were used, and the ratio of $N_2$ was set so as to account for 48% of the sum of volumetric flow rates of all the gasses fed into the growth furnace.

The grown GaN crystal presented a continuous film extending from the one substrate to the other, and the film thickness was about 5.1 mm.

Out of this GaN crystal, an M-plane substrate with an off-angle was cut, which had rectangular main surfaces having longer sides parallel to the a-axis and shorter sides parallel to the c-axis, and a size of 25.5 mm (length)×12.5 mm (width)×354 μm (thickness). The off-angle was set to be −5° in the [0001] direction, and within ±0.1° in the [−12-10] direction. Both of the main surfaces were subjected to lapping and CMP processing, and a damaged layer formed by slicing was completely removed.

For one of the obtained M-plane GaN substrate, basal plane dislocation density and stacking fault density in the main surface thereof (corresponding to the part of growth thickness of about 2 mm) were measured. The results were a basal plane dislocation density of $3.1 \times 10^5$ cm$^{-2}$ measured by the room-temperature cathode luminescence method (acceleration voltage 7 kV, electric current 2 nA, 1000-fold magnification) and a stacking fault density of 1.8 cm$^{-1}$ measured by the low-temperature cathode luminescence method (acceleration voltage 7 kV, electric current 2 nA, 200-fold magnification, sample temperature 82K).

Carrier density measured by Raman spectroscopy in the vicinity of the main surface of the M-plane GaN substrate was from $5.8 \times 10^{18}$ to $1.3 \times 10^{19}$ cm$^{-3}$.

The carriers were attributed to oxygen incorporated into the GaN crystal during the vapor phase epitaxy.

3. Experiment 3

(1) Fabrication of M-Plane GaN Substrate

A C-plane GaN template having a single crystalline GaN layer grown on a sapphire substrate was prepared by metalorganic chemical vapor deposition (MOCVD) method.

On the GaN layer of the C-plane GaN template, a mask pattern for selective growth was formed, which was composed of a silicon nitride film of 80 nm thickness and presented the superposition of a dot pattern and a triangular lattice pattern.

For the dot pattern included in the above described superposed pattern, regular hexagonal dots were arranged on the lattice points of the square lattices formed by unit lattices being a square with each side of 800 μm. The square lattices were arranged so that the two sides of the square unit lattice were oriented parallel to the a-axis of GaN layer and the other sides parallel to the m-axis thereof. Each of the dots was arranged so that each of the sides of the regular hexagon was oriented parallel to the m-axis of the GaN layer. The size of each of the dots was determined so that the distance between the two sides parallel to each other of the regular hexagon was 100 μm, i.e. the length of each of the sides of the regular hexagon was 57.7 μm.

For the triangular lattice pattern included in the above described superposed pattern, the line width of the pattern W was set to be 2 μm, and the height of the triangle formed by line segments connecting the neighboring lattice points was set to be 20 μm. Accordingly, the lattice pitch (distance between two neighboring lattice points) P was 23.1 μm. The triangular lattice pattern was arranged so that each of the lines composing the triangular lattices was parallel to the a-axis of the GaN layer.

Then, on the above-described C-plane GaN template having the mask for selective growth formed thereon, a GaN crystal was grown by the HVPE method. The growth temperature was 965° C. for initial 15 minutes, and then, raised to 1005° C. The growth pressure was $1.0 \times 10^5$ Pa, the GaCl partial pressure $1.0 \times 10^3$ Pa, and the $NH_3$ partial pressure $1.0 \times 10^4$ Pa. The growth time period was 51 hours.

Due to the generation of a facet growth mode, the GaN crystal during the growth was doped with oxygen. Oxygen was attributed to oxygen compounds such as $H_2O$ incorporated into the feedstock, or to quartz members configuring the vapor phase epitaxy apparatus.

The thickness of the as-grown GaN crystal was 9.9 mm, and the surface thereof was bumpy, indicating that the facet growth was maintained.

The curvature radius of the (0001) surface of the as-grown crystal examined by X-ray diffraction analysis was 59 m in the a-axis direction and 13 m in the m-axis direction.

Out of the obtained GaN crystal, an M-plane substrate with an off-angle was cut, which had rectangular main surfaces having longer sides parallel to the a-axis and shorter sides parallel to the c-axis, and a size of 30 mm (length)×5 mm (width)×330 μm (thickness). The off-angle was set to be −5° in the direction, and within ±0.1° in the [−12-10] direction. Both of the main surfaces were subjected to lapping and CMP processing, and a damaged layer formed by slicing was completely removed.

Basal plane dislocation density in the main surface of this M-plane GaN substrate was $8.0 \times 10^5$ cm$^{-2}$ by the room-temperature cathode luminescence method (3 kV, 100 pA, 1000-fold magnification).

(2) GaN Crystal Growth by HVPE Method

A GaN crystal was grown by the HVPE method by using the M-plane GaN substrate fabricated in the above described (1) as a seed.

For the GaN crystal growth, the above-mentioned two-stage growth method was used. In other words, the susceptor placed in the growth furnace was surmounted by the seed substrate so that one main surface of the substrate turned up, and then, the substrate temperature was raised up to 850° C. with only $N_2$ and $NH_3$ initially fed onto the seed substrate (heating step), and the temperature was kept for 15 minutes.

Then, feeding GaCl onto the seed substrate was initiated by feeding HCl diluted with $N_2$ into the reservoir heated to 800° C. which holded metallic gallium, and the substrate temperature was raised at a rate of 21° C./min (initial growth step).

After the substrate temperature reached 950° C., the substrate temperature was kept constant while GaN crystal was grown for 50 hours by feeding GaCl and NH$_3$ onto the seed substrate (main growth step).

From the start of the heating step to the end of the main growth step, the pressure in the growth furnace was controlled to be $1.0 \times 10^5$ Pa, the GaCl partial pressure $4.1 \times 10^2$ Pa and the ammonia partial pressure $1.3 \times 10^4$ Pa. For carrier gasses, N$_2$ and H$_2$ were used, and the ratio of N$_2$ was set so as to account for 48% of the sum of volumetric flow rates of all the gasses fed into the growth furnace.

The thickness of the obtained GaN crystal layer was about 4.0 mm.

Out of this GaN crystal, a plurality of M-plane substrates with an off-angle were cut, which had rectangular main surfaces having longer sides parallel to the a-axis and shorter sides parallel to the c-axis. The off-angle was set to be −5° in the [0001] direction, and within ±0.1° in the [−12-10] direction.

For one of the plurality of the fabricated M-plane GaN substrates, stacking fault density in the main surface (corresponding to the part of the growth thickness of about 2 mm) was 27 cm$^{-1}$ by the low-temperature cathode luminescence method (acceleration voltage 7 kV, electric current 2 nA, 300-fold magnification, sample temperature 82K).

4. Experiment 4

(1) Fabrication of Primary Substrate (C-Plane GaN Substrate)

Except that the GaCl partial pressure in the growth furnace was set to be $1.4 \times 10^3$ Pa and the NH$_3$ partial pressure $1.1 \times 10^4$ Pa, GaN crystal was grown by the HVPE method on the C-plane GaN template having a mask pattern for selective growth thereon in the same manner as that in Experiment 3. (1).

The thickness of the as-grown GaN crystal was 10.1 mm, and the surface thereof was bumpy, indicating that the facet growth was maintained.

The curvature radius of the (0001) surface of the as-grown crystal examined by X-ray diffraction analysis was 22 m in the a-axis direction and 191 m in the m-axis direction.

Out of this GaN crystal, a C-plane substrate with 70 mm diameter was cut. The +C-plane was subjected to lapping and CMP processing to completely remove a damaged layer formed by slicing.

(2) Fabrication of Secondary Substrate (M-Plane GaN Substrate)

On the +C-plane of the C-plane GaN substrate fabricated in above (1), a GaN crystal was grown by the HVPE method. The growth temperature was 1065° C. for initial one hour and 40 minutes, and then, lowered to 1005° C. The growth pressure was $1.0 \times 10^5$ Pa, the GaCl partial pressure $6.3 \times 10^2$ Pa, and the NH$_3$ partial pressure $7.4 \times 10^3$ Pa. The growth time period was 20 hours in total.

The thickness of the as-grown GaN crystal was 3.0 mm, and the surface thereof was a mirror surface (C-plane).

Out of the this GaN crystal, an M-plane substrates with an off-angle was cut, which had rectangular main surfaces having longer sides parallel to the a-axis and shorter sides parallel to the c-axis, and a size of 30 mm (length)×2.5 mm (width)×330 μm (thickness). The off-angle was set to be −5° in the [0001] direction, and within ±0.1° in the [−12-10] direction. Both of the main surfaces were subjected to lapping and CMP processing, and a damaged layers formed by slicing was completely removed.

Basal plane dislocation density in the main surface of this M-plane GaN substrate was $1.0 \times 10^4$ cm$^{-2}$ or less by the room-temperature cathode luminescence method (3 kV, 100 pA, 1000-fold magnification).

(3) GaN Crystal Growth by HVPE Method

GaN crystal was grown by HVPE method by using the secondary substrate fabricated in the above described (2) as a seed.

For the GaN crystal growth, the above-mentioned two-stage growth method was used. In other words, the susceptor placed in the growth furnace was surmounted by the seed substrate so that one main surface of the substrate turned up, and then, the substrate temperature was raised up to 850° C. with only N$_2$ and NH$_3$ initially fed onto the seed substrate (heating step), and the temperature was kept for 15 minutes.

Then, feeding GaCl onto the seed substrate was initiated by feeding HCl diluted with N$_2$ into the reservoir heated to 800° C. which holded metallic gallium, and the substrate temperature was raised at a rate of 21° C./min (initial growth step).

After the substrate temperature reached 950° C., the substrate temperature was kept constant while GaN crystal was grown for 15 hours by feeding GaCl and NH$_3$ onto the seed substrate (main growth step).

From the start of the heating step to the end of the main growth step, the pressure in the growth furnace was controlled to be $1.0 \times 10^5$ Pa, the GaCl partial pressure $4.1 \times 10^2$ Pa and the ammonia partial pressure $1.3 \times 10^4$ Pa. For carrier gasses, N$_2$ and H$_2$ were used, and the ratio of N$_2$ was set so as to account for 48% of the sum of volumetric flow rates of all the gasses fed into the growth furnace.

The thickness of the obtained GaN crystal layer was about 1.5 mm.

The stacking fault density of the as-grown GaN crystal was 0 cm$^{-1}$ from evaluation by the low-temperature cathode luminescence method (7 kV, 2 nA, 300-fold magnification, sample temperature 82K).

5. Experiment 5

(1) Fabrication of M-Plane GaN Substrate

A C-plane GaN template having a non-doped GaN layer epitaxially grown on a sapphire substrate by the MOCVD method was prepared. Then, a mask pattern for selective growth was formed on the surface of the GaN layer by using the silicon nitride film.

The mask pattern was configured to be a stripe pattern (line-and-space pattern) of 850 μm pitch with 50 μm line width (mask width) and 800 μm space width, and the stripe was oriented parallel to the direction of the m-axis of the single crystalline GaN layer.

On the above-described C-plane GaN template provided with the mask pattern thereon, an undoped GaN layer was laterally epitaxially grown by the MOCVD method to obtain a seed substrate. On this seed substrate, a GaN crystal was grown by the HVPE method. The growth temperature was 1010° C., and the growth pressure was $1.0 \times 10^5$ Pa, the GaCl partial pressure $6.6 \times 10^2$ Pa, and the NH$_3$ partial pressure $7.6 \times 10^3$ Pa. The growth time period was 64 hours.

The thickness of the as-grown GaN crystal was 8.3 mm. Out of this GaN crystal, an M-plane substrate with an off-angle was cut, which had rectangular main surfaces having longer sides parallel to the a-axis and shorter sides parallel to the c-axis, and a size of 50 mm (length)×5 mm (width)×330 μm (thickness). The off-angle was set to be −5° in the [0001] direction, and within ±0.1° the [−12-10] direction. Both of the main surfaces were subjected to lapping and CMP processing, and a damaged layer formed by slicing was completely removed.

Basal plane dislocation density in the main surface of this M-plane GaN substrate was $5\times10^6$ cm$^{-2}$ by the room-temperature cathode luminescence method (3 kV, 100 pA, 1000-fold magnification).

2) GaN Crystal Growth by HVPE Method

GaN crystal was grown by the HVPE method by using the M-plane GaN substrate fabricated in the above described (1) as a seed.

In the GaN crystal growth, the above-mentioned two-stage growth method was used. In other words, the susceptor in the growth furnace was surmounted by the seed substrate, and then, the substrate temperature was raised up to 850° C. with only N$_2$ and NH$_3$ initially fed onto the seed substrate, and the temperature was kept for 15 minutes. Then, feeding GaCl onto the seed substrate was initiated by feeding HCl diluted with N$_2$ into the reservoir heated to 800° C. which holded metallic gallium, and the substrate temperature was raised at a rate of 21° C./min. After the substrate temperature reached 950° C., the substrate temperature was kept constant while GaN crystal was grown for 30 hours by feeding GaCl and NH$_3$ onto the seed substrate.

From the start of the heating step to the end of the main growth step, the pressure in the growth furnace was controlled to be $1.0\times10^5$ Pa, the GaCl partial pressure $3.5\times10^2$ Pa and the NH$_3$ partial pressure $1.1\times10^4$ Pa.

The thickness of the obtained GaN crystal layer was about 0.8 mm.

The basal plane dislocation density of the as-grown GaN crystal was $1.5\times10^6$ cm$^{-2}$ by the room-temperature cathode luminescence method (3 kV, 100 pA, 1000-fold magnification).

The stacking fault density of the as-grown GaN crystal was $1.5\times10^2$ cm$^{-1}$ by the low-temperature cathode luminescence method (5 kV, 500 pA, 200-fold magnification, sample temperature 82K).

6. Experiment 6

(1) Fabrication of M-Plane GaN Substrate

Out of the GaN crystal grown on the C-plane GaN template by the same method as that in (1) of Experiment 5, an M-plane just substrate (M-plane substrate provided with no off-angle) was cut, which had rectangular main surfaces having longer sides parallel to the a-axis and shorter sides parallel to the c-axis, and a size of 20 mm (length)×10 mm (width)×330 μm (thickness). Both of the main surfaces were subjected to lapping and CMP processing, and a damaged layer formed by slicing was completely removed.

Basal plane dislocation density in the main surface of this M-plane GaN substrate was $5\times10^6$ cm$^{-2}$ by the room-temperature cathode luminescence method (3 kV, 100 pA, 1000-fold magnification).

(2) GaN Crystal Growth by Ammonothermal Method

A GaN crystal was grown by the ammonothermal method by using the M-plane GaN substrate fabricated in the above described (1) as a seed.

The condition of the ammonothermal method was the same as that in (2) of Experiment 1 except that the additive amounts of the mineralizers were changed so that the mole ratios of fluorine and iodine atoms to ammonia were 0.2% and 1.5%, respectively, and the number of day period for the growth was 9.1 days.

The size of the as-grown GaN crystal was 11 mm (in the c-axis direction)×20 mm (in the a-axis direction)×1.8 mm (in the m-axis direction).

A plurality of M-plane substrates were cut out of this GaN crystal. Both of the main surfaces of the cut substrate were subjected to lapping and CMP processing, and a damaged layer formed by slicing was completely removed.

Stacking fault density in the main surface of the M-plane GaN substrate was $1.5\times10^2$ cm$^{-1}$ by the low-temperature cathode luminescence method (5 kV, 500 pA, 200-fold magnification, sample temperature 82K).

The results of Experiments 1 to 6 are summarized in Table 1.

TABLE 1

| | | Experiment 1 | Experiment 2 | Experiment 3 | Experiment 4 | Experiment 5 | Experiment 6 |
|---|---|---|---|---|---|---|---|
| seed substrate | oxygen concentration (cm$^{-3}$) | $8.7\times10^{18}$ | $2.3\times10^{18}$ | — | — | — | — |
| | basal plane dislocation density (cm$^{-2}$) | not detected | not detected | $8\times10^5$ | $\leq1\times10^4$ | $5\times10^6$ | $5\times10^6$ |
| GaN crystal grown on seed substrate | oxygen concentration (cm$^{-3}$) | $4.0\times10^{18}$ | — | — | — | — | — |
| | carrier density (cm$^{-3}$) | $2.5\times10^{18}$ | $5.8\times10^{18}$-$1.3\times10^{19}$ | — | — | — | — |
| | stacking fault density (cm$^{-1}$) | not detected | 1.8 | 27 | 0 | 150 | 150 |

While the invention has been described in detail and with reference to specific embodiments thereof, it will be apparent to one skilled in the art that various changes and modifications can be made therein without departing from the spirit and scope thereof.

DESCRIPTION OF SYMBOLS 1 substrate
11 main surfaces
12 edge surface
2 crystal growth apparatus
200 growth furnace
201~205 introduction pipe
206 reservoir
207 heater
208 susceptor
209 exhaust tube
3 crystal growth apparatus
301 autoclave
304 platinum wire
305 baffle 306 crystal growth zone
307 seed crystal
308 feedstock
309 feedstock dissolution zone
310 valve
311 vacuum pump
312 ammonia tank
313 nitrogen tank
314 mass flow meter
320 growth vessel
40A semiconductor light-emitting device
40B semiconductor light-emitting device
41 GaN substrate
42 n-type layer
43 light-emitting layer
44 p-type layer
45 positive electrode
46 negative electrode

The invention claimed is:

1. A method for manufacturing an M-plane GaN substrate comprising;
   forming a mask pattern having a line-shaped opening parallel to an a-axis of a C-plane GaN substrate on an N-polar plane of the C-plane GaN substrate,
   growing a plane-shape GaN crystal of which thickness direction is an m-axis direction from the opening of the mask pattern by an ammonothermal method, and
   cutting out the M-plane GaN substrate from the plane-shape GaN crystal.

2. A method for manufacturing a GaN substrate having an M-plane or a semi-polar plane as a main surface comprising;
   forming a mask pattern having a line-shaped opening parallel to an a-axis of a C-plane GaN substrate on an N-polar plane of the C-plane GaN substrate,
   growing a plane-shape first GaN crystal of which thickness direction is an m-axis direction from the opening of the mask pattern by an ammonothermal method,
   cutting out an M-plane seed substrate from the plane-shape first GaN crystal,
   growing a second GaN crystal using the M-plane seed substrate as a seed by an ammonothermal method, and
   cutting out the GaN substrate having an M-plane or semi-polar plane as a main surface from the second GaN crystal.

3. The method for manufacturing a GaN substrate according to claim 2, wherein the semi-polar plane is {30-31}, {30-3-1}, {20-21}, {20-2-1}, {10-11}, or {10-1-1}.

4. The method for manufacturing a GaN substrate according to claim 2, wherein the area of the main surface is 1.0 cm$^2$ or more.

5. The method for manufacturing a GaN substrate according to claim 4, wherein averaged basal plane dislocation density in an optional square region sizing 250 μm×250 μm in the main plane is 1×10$^6$ cm$^{-2}$ or less.

6. The method for manufacturing a GaN substrate according to claim 5, wherein the basal plane dislocation density in the main plane is 1×10$^4$ cm$^{-2}$ or less.

7. The method for manufacturing a GaN substrate according to claim 6, wherein the basal plane dislocation density in the main plane is 1×10$^2$ cm$^{-2}$ or less.

8. The method for manufacturing a GaN substrate according to claim 6, wherein the averaged basal plane dislocation density in the optional square region sizing 250 μm×250 μm in the main plane is 1×10$^4$ cm$^{-2}$ or less.

9. The method for manufacturing a GaN substrate according to claim 5, wherein stacking fault density in the main surface is 10 cm$^{-1}$ or less.

10. A method for manufacturing a GaN substrate having an M-plane or semi-polar plane as a main surface comprising;
    forming a mask pattern having a line-shaped opening parallel to an a-axis of a C-plane GaN substrate on an N-polar plane of the C-plane GaN substrate,
    growing a plane-shape first GaN crystal of which thickness direction is an m-axis direction from the opening of the mask pattern by an ammonothermal method,
    cutting out an M-plane first seed substrate from the plane-shape first GaN crystal,
    growing a second GaN crystal using the M-plane first seed substrate as a seed by an ammonothermal method,
    cutting out a second seed substrate having an M-plane or semi-polar plane as a main surface from the second GaN crystal,
    growing a third GaN crystal using the second seed substrate as a seed by a vapor phase growth method, and
    cutting out the GaN substrate having an M-plane or semi-polar plane as a main surface from the third GaN crystal.

11. The method for manufacturing a GaN substrate according to claim 10, wherein the vapor phase growth method is a HVPE method.

12. The method for manufacturing a GaN substrate according to claim 10, wherein the main surface of the GaN substrate cut out from the third GaN crystal is {10-10}, {30-31}, {30-3-1}, {20-21}, {20-2-1}, {10-11}, or {10-1-1}.

13. The method for manufacturing a GaN substrate according to claim 10, wherein the area of the main surface of the second seed substrate is 1.0 cm$^2$ or more.

14. The method for manufacturing a GaN substrate according to claim 10, wherein averaged basal plane dislocation density in an optional square region sizing 250 μm×250 μm in the main plane of the second seed substrate is 1×10$^6$ cm$^{-2}$ or less.

15. The method for manufacturing a GaN substrate according to claim 14, wherein the basal plane dislocation density in the main plane of the second seed is 1×10$^4$ cm$^{-2}$ or less.

16. The method for manufacturing a GaN substrate according to claim 15, wherein the basal plane dislocation density in the main plane of the second seed is 1×10$^2$ cm$^{-2}$ or less.

17. The method for manufacturing a GaN substrate according to claim 15, wherein the averaged basal plane dislocation density in an optional square region sizing 250 μm×250 μm in the main plane of the second seed is 1×10$^4$ cm$^{-2}$ or less.

18. The method for manufacturing a GaN substrate according to claim 14, wherein stacking fault density in the main surface of the second seed is 10 cm$^{-1}$ or less.

* * * * *